(12) United States Patent
Lee et al.

(10) Patent No.: US 11,579,717 B2
(45) Date of Patent: Feb. 14, 2023

(54) TOUCH DISPLAY DEVICE AND METHOD FOR DRIVING THE SAME

(71) Applicant: LG Display Co., Ltd., Seoul (KR)

(72) Inventors: Yang Sik Lee, Seoul (KR); Sang Hyuck Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/565,854

(22) Filed: Dec. 30, 2021

(65) Prior Publication Data

US 2022/0206652 A1 Jun. 30, 2022

(30) Foreign Application Priority Data

Dec. 31, 2020 (KR) .................. 10-2020-0189501

(51) Int. Cl.
*G06F 3/041* (2006.01)
*G06F 3/044* (2006.01)
*G09G 3/3258* (2016.01)

(52) U.S. Cl.
CPC .......... *G06F 3/0412* (2013.01); *G06F 3/0443* (2019.05); *G06F 3/04164* (2019.05); *G09G 3/3258* (2013.01)

(58) Field of Classification Search
CPC ........... G06F 3/0412; G06F 3/041–047; G06F 2203/041–04114; H01L 27/323; H01L 27/32–3293
See application file for complete search history.

(56) References Cited

U.S. PATENT DOCUMENTS

| 10,761,632 | B2 | 9/2020 | Hwang et al. | |
|---|---|---|---|---|
| 10,955,952 | B2 | 3/2021 | Gwon et al. | |
| 2017/0220150 | A1* | 8/2017 | Wu | ............ H01L 27/3248 |
| 2017/0316740 | A1* | 11/2017 | Yang | ............ G09G 3/3266 |
| 2018/0113531 | A1* | 4/2018 | Na | ............ G09G 3/2092 |
| 2018/0181242 | A1* | 6/2018 | Mizuhashi | .......... G06F 3/04184 |
| 2018/0239488 | A1 | 8/2018 | Lin et al. | |

FOREIGN PATENT DOCUMENTS

| CN | 205353991 U | 6/2016 |
|---|---|---|
| EP | 3674858 A2 | 7/2020 |
| KR | 10-2018-0025475 A | 3/2018 |
| KR | 10-2019-0056921 A | 5/2019 |
| RE | 10-2018-0046865 A | 5/2018 |
| WO | WO 2017041290 A1 | 3/2017 |

* cited by examiner

*Primary Examiner* — Sanjiv D. Patel
(74) *Attorney, Agent, or Firm* — Seed IP Law Group LLP

(57) ABSTRACT

A touch display device and a method for driving the same is disclosed. The present disclosure provides a touch display device including a display panel including sub-pixels, a touch sensor including a touch electrode formed electrically in common with an electrode of a light-emitting diode included in the sub-pixels, and a touch driver configured to sense the touch sensor, wherein the electrode of the light-emitting diode serves as the touch electrode for a turn-off period of an emission control transistor for controlling emission of the light-emitting diode.

18 Claims, 28 Drawing Sheets

TOUCH DISPLAY DEVICE AND METHOD FOR DRIVING THE SAME

CROSS-REFERENCE TO RELATED APPLICATION

This application claims the benefit of Korean Patent Application No. 10-2020-0189501 Dec. 31, 2020, which is hereby incorporated by reference as if fully set forth herein.

BACKGROUND

Technical Field

The present disclosure relates to a touch display device and a method for driving the same.

Description of the Related Art

With the development of information technology, the market for display devices serving as connecting media between users and information is growing. Accordingly, display devices such as a light emitting display (LED), a quantum dot display (QDD), and a liquid crystal display (LCD) are increasingly used.

The aforementioned display devices include a display panel including sub-pixels, a driver that outputs driving signals for driving the display panel, and a power supply that generates power to be supplied to the display panel and the driver.

The display devices as described above can display images by transmitting light or directly emitting light through selected sub-pixels when driving signals, for example, a scan signal and a data signal, are supplied to sub-pixels formed in a display panel. Furthermore, the display devices as described above can receive user input in the form of touch based on a touch sensor and execute a command corresponding to touch input.

BRIEF SUMMARY

Accordingly, the present disclosure is directed to a touch display device and a method for driving the same that substantially obviate one or more problems due to limitations and disadvantages of the related art.

One or more embodiments of the present disclosure decrease the thickness of a touch display device, simplify a manufacturing process of a display panel having a touch sensor, and reduce display panel manufacturing costs by realizing a touch sensor electrically in common with an anode and a cathode included in a light-emitting diode.

In some embodiments, the present disclosure may provide a touch display device including a display panel including sub-pixels, a touch sensor including a touch electrode formed electrically in common with an electrode of a light-emitting diode included in the sub-pixels, and a touch driver configured to sense the touch sensor, wherein the electrode of the light-emitting diode serves as the touch electrode for a turn-off period of an emission control transistor for controlling emission of the light-emitting diode. The electrode acts to drive the light-emitting diode during a turn-on period of the emission control transistor.

The electrode of the light-emitting diode may be an anode or a cathode.

The cathode of the light-emitting diode may be connected to a second power line at a low voltage for a display operation period for displaying an image on the display panel.

The cathode of the light-emitting diode may electrically float or may be electrically connected to the touch driver for a touch operation period for touch sensing of the touch sensor.

The touch display device may further include a first control transistor disposed between a second electrode of the emission control transistor and the anode of the light-emitting diode, and the first control transistor may be turned on for a display operation period for displaying an image on the display panel.

The touch display device may further include a second control transistor disposed between the anode of the light-emitting diode and a sensing channel of the touch driver, and the second control transistor may be turned on for a touch operation period for touch sensing of the touch sensor.

The first control transistor and the second control transistor may be configured as n-type transistors, p-type transistors, or n-type and p-type transistors.

The touch driver may perform a sensing operation through the electrode of the light-emitting diode for the turn-off period of the emission control transistor.

The touch display device may further include a selector configured to connect the cathode of the light-emitting diode to the second power line at a low voltage for a display operation period for displaying an image on the display panel and to cause the cathode of the light-emitting diode to electrically float for a touch operation period for touch sensing of the touch sensor, a first control transistor disposed between the second electrode of the emission control transistor and the anode of the light-emitting diode and turned on for the display operation period, and a second control transistor disposed between the anode of the light-emitting diode and the sensing channel of the touch driver and turned on for the touch operation period, wherein the electrode of the light-emitting diode may be the anode.

The touch display device may further include a selector configured to connect the cathode of the light-emitting diode to the second power line at a low voltage for a display operation period for displaying an image on the display panel and to electrically connect the cathode of the light-emitting diode to the touch driver for a touch operation period for touch sensing of the touch sensor, and a first control transistor disposed between the second electrode of the emission control transistor and the anode of the light-emitting diode and turned on for the display operation period, wherein the electrode of the light-emitting diode may be the cathode.

The touch display device may further include a first control transistor disposed between the second electrode of the emission control transistor and the anode of the light-emitting diode and turned on for the display operation period, and a second control transistor disposed between the cathode of the light-emitting diode and the sensing channel of the touch driver and turned on for the touch operation period, wherein the electrode of the light-emitting diode may be the cathode.

In other embodiments, the present disclosure may provide a method for driving a touch display device including a display panel including sub-pixels, a touch sensor including a touch electrode formed electrically in common with an electrode of a light-emitting diode included in the sub-pixels, and a touch driver configured to sense the touch sensor. The method for driving a touch display device may include causing the sub-pixels to emit light for a display operation period for displaying an image on the display panel, and sensing one of electrodes of the light emitting diode for a touch operation period for touch sensing of the touch sensor, wherein the electrode of the light-emitting diode serves as the touch electrode for a turn-off period of an emission control transistor for controlling emission of the light-emitting diode. The electrode acts as and LED electrode to drive the light-emitting diode during a turn-on period of the emission control transistor.

The sensing may include causing a cathode of the light-emitting diode to electrically float for the touch operation period, turning off a first control transistor disposed between a second electrode of the emission control transistor and an anode of the light-emitting diode, turning on a second control transistor disposed between the anode of the light-emitting diode and a sensing channel of the touch driver, and sensing the anode of the light-emitting diode.

The sensing may include electrically connecting the cathode of the light-emitting diode to the touch driver for the touch operation period, turning off a first control transistor disposed between the second electrode of the emission control transistor and the anode of the light-emitting diode, and sensing the cathode of the light-emitting diode.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

A touch display device according to the present disclosure can receive user input in the form of touch based on a touch sensor and execute a command corresponding to touch input. The touch display device may be implemented as a television set, a video player, a personal computer (PC), a home theater system, an automobile electric device, a smartphone, or the like, but is not limited thereto.

The touch display device according to the present disclosure may be implemented as a light emitting display (LED) device, a quantum dot display (QDD) device, a liquid crystal display (LCD) device, and the like. However, an LED device that directly emits light based on inorganic light-emitting diodes or organic light-emitting diodes will be exemplified below for convenience of description.

Furthermore, a self-capacitive touch sensor that detects change in capacitance based on a single touch sensor or a mutual-capacitive touch sensor that detects change in capacitance based on two touch electrodes may be applied as a touch sensor. However, the self-capacitive touch sensor will be exemplified for convenience of description.

Figure 1:
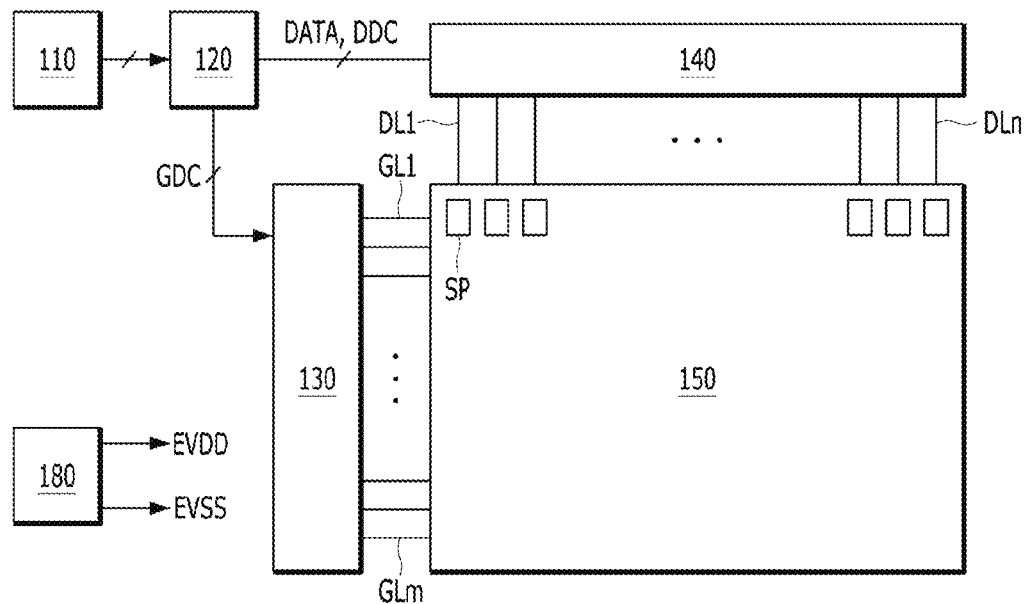
FIG. 1 is a block diagram schematically illustrating a light emitting display device.
Figure 2:
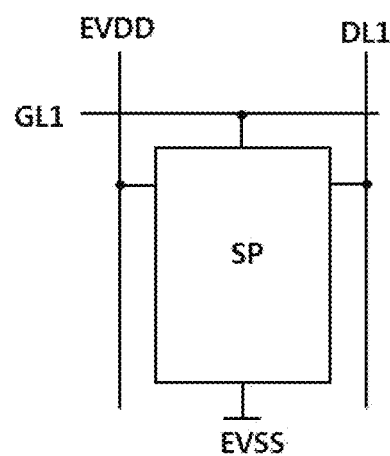
FIG. 2 is a diagram schematically illustrating a sub-pixel illustrated in FIG. 1.

FIG. 1 is a block diagram schematically illustrating a light emitting display device and FIG. 2 is a diagram schematically illustrating a sub-pixel illustrated in FIG. 1.

As illustrated in FIG. 1 and FIG. 2, the light emitting display device may include an image provider 110, a timing controller 120, a scan driver 130, a data driver 140, a display panel 150, and a power supply 180.

The image provider 110 (or a host system) may output various driving signals along with an image data signal supplied from the outside or an image data signal stored in an internal memory. The image provider 110 may provide a data signal and various driving signals to the timing controller 120.

The timing controller 120 may output a gate timing control signal GDC for controlling operation timing of the scan driver 130, a data timing control signal DDC for controlling operation timing of the data driver 140, and various synchronization signals (a vertical synchronization signal Vsync and a horizontal synchronization signal Hsync). The timing controller 120 may provide a data signal DATA supplied from the image provider 110 along with the data timing control signal DDC to the data driver 140. The timing controller 120 may be configured as an integrated circuit (IC) and may be mounted on a printed circuit board, but the present disclosure is not limited thereto.

The scan driver 130 may output a scan signal (or a scan voltage) in response to the gate timing control signal GDC supplied from the timing controller 120. The scan driver 130 may provide the scan signal to the sub-pixels included in the display panel 150 through scan lines GL1 to GLm. The scan driver 130 may be configured as an IC or may be directly formed on the display panel 150 in a gate in panel structure.

The data driver 140 may sample and latch a data signal DATA in response to the data timing control signal DDC supplied from the timing controller 120, convert the data signal in a digital form into a data voltage in an analog form on the basis of a gamma reference voltage, and output the data voltage. The data driver 140 may provide the data voltage to sub-pixels included in the display panel 150 through data lines DL1 to DLn. The data driver 140 may be formed in the form of an IC and mounted on the display panel 150 or mounted on a printed circuit board, but the present disclosure is not limited thereto.

The power supply 180 may generate first power at a high level and second power at a low level based on an external input voltage and output the first power and the second power through a first power line EVDD and a second power line EVSS. The power supply 180 may generate and output voltages (e.g., gate voltages including a gate high voltage and a gate low voltage) necessary for operation of the scan driver 130 and voltages (e.g., drain voltages including a drain voltage and a half drain voltage) necessary for operation of the data driver 140 as well as the first power and the second power.

The display panel 150 may display an image in response to driving signals including a scan signal and a data voltage, the first power and the second power. Sub-pixels of the display panel 150 directly emit light. The display panel 150 may be manufactured based on a rigid or flexible substrate such as a glass substrate, a silicon substrate, or a polyimide substrate. The sub-pixels emitting light may include red, green and blue pixels or red, green, blue, and white pixels.

For example, a single sub-pixel SP may be connected to a first data line DL1, a first gate line GL1, the first power line EVDD, and the second power line EVSS. A single sub-pixel SP may have a pixel circuit including a switching transistor, a driving transistor, a capacitor, and an organic light emitting diode. A sub-pixel used in a light emitting display device directly emits light and thus has a complicated circuit configuration. Further, a sub-pixel includes not only an organic light-emitting diode but also a compensation circuit for compensating for deterioration of a driving transistor that supplies driving current to the organic light-emitting diode. Accordingly, a sub-pixel (SP) is simply illustrated in the form of a block in the figure.

Although the timing controller 120, the scan driver 130, and the data driver 140 have been described as individual components, one or more of the timing controller 120, the scan driver 130, and the data driver 140 may be integrated in a single IC according to a light emitting display device implementation method.

Figure 3:
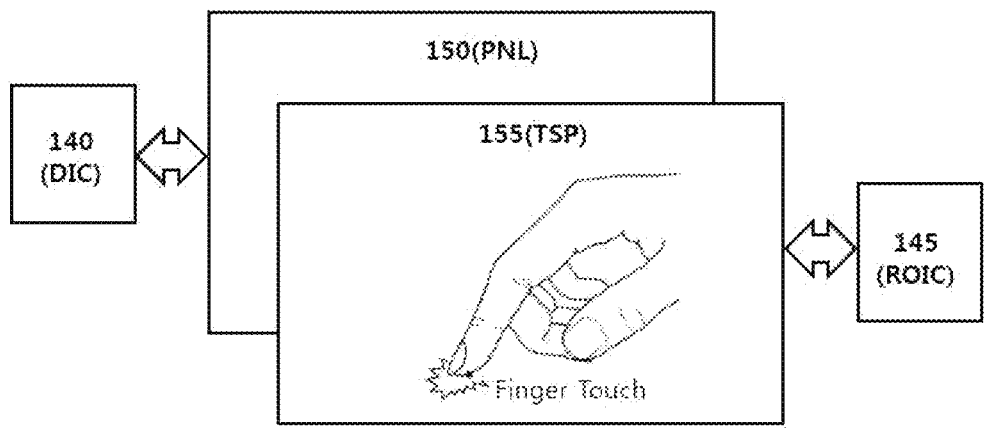
FIG. 3 to FIG. 5 are diagrams for briefly describing a touch display device.
Figure 4:
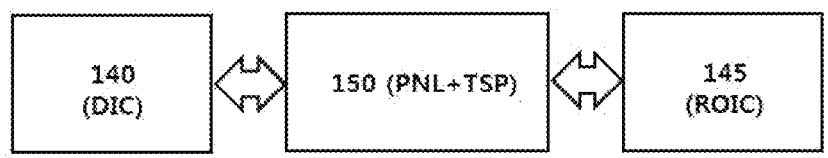
Figure 5:
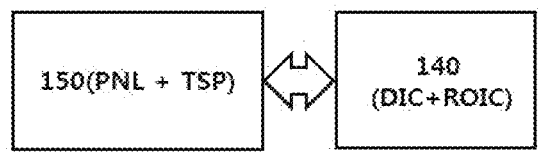

FIG. 3 to FIG. 5 are diagrams for briefly describing a touch display device.

As illustrated in FIG. 3 and FIG. 4, the touch display device may include a display panel (PNL) 150, a touch sensor (TSP) 155, a data driver (DIC) 140, and a touch driver (ROIC) 145 (readout circuit or sensing circuit).

The touch sensor 155 is an input device that may receive user input as touch input and may be provided along with the display panel 150 that displays images. More specifically, the touch sensor 155 may be formed in an in-cell type through a series of processes for manufacturing the display panel 150. That is, a touch electrode of the touch sensor 155 may be formed in the display panel 150 (integrated with the display panel).

The touch driver 145 may detect presence or absence of touch applied to the display panel 150, input position information, and the like through a process of applying a touch driving voltage through the touch electrode included in the touch sensor 155 and then sensing touch. The touch driver 145 operates along with the touch sensor 155 and may sense finger touch from a user (or pen touch from a user).

As illustrated in FIG. 4 and FIG. 5, the touch driver (ROIC) 145 may be configured in the form of an IC separately from the data driver 140 or may be included in the data driver 140 according to an implementation method of the display panel 150 and the touch sensor 155.

Figure 6:
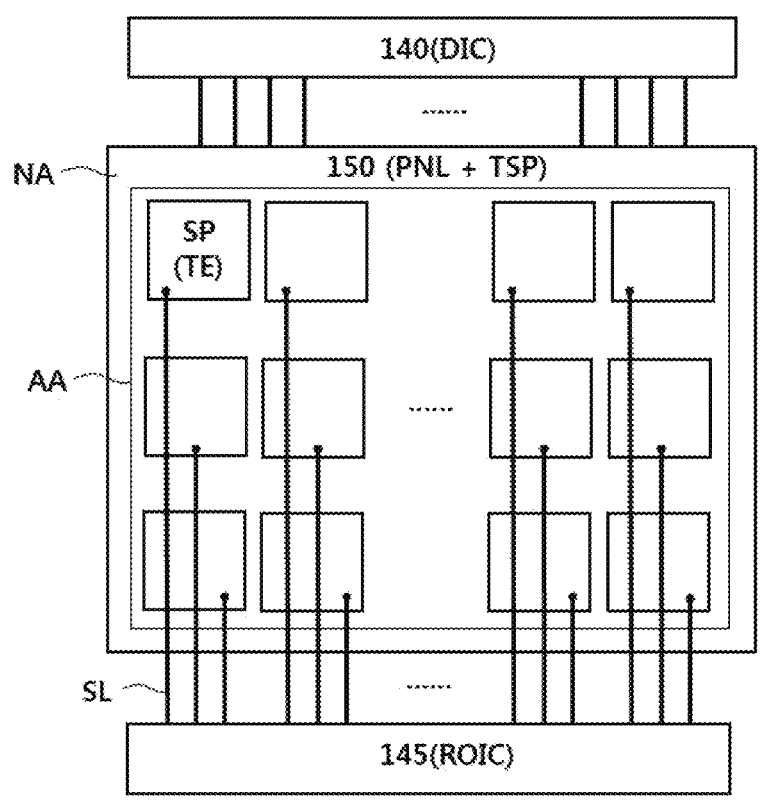
FIG. 6 is a block diagram schematically illustrating a touch display device according to a first embodiment of the present disclosure.
Figure 7:
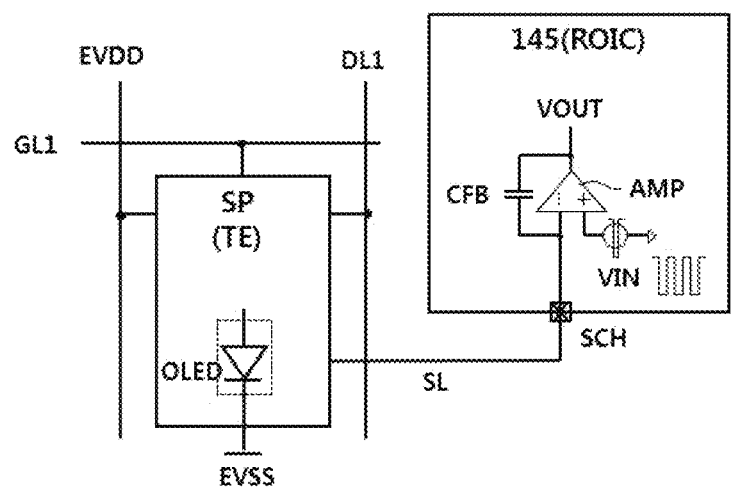
FIG. 7 is a diagram for briefly describing a part of the touch display device according to the first embodiment of the present disclosure.
Figure 8:
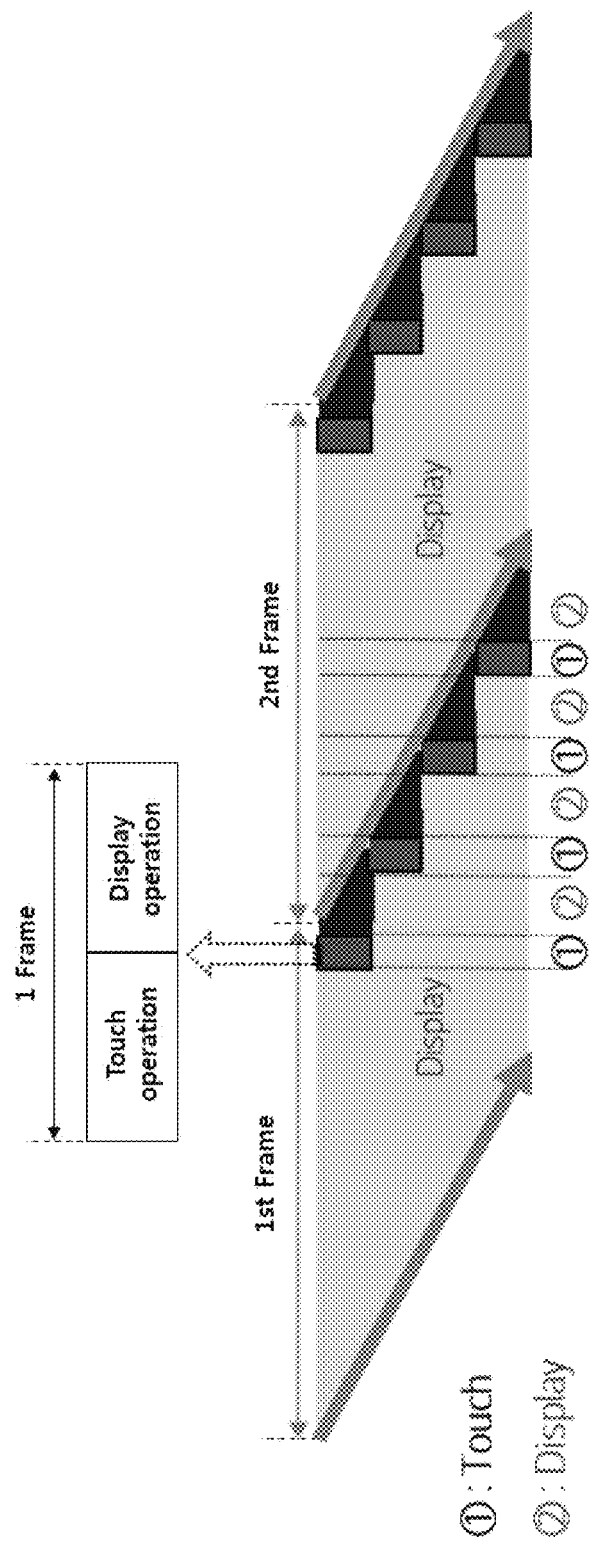
FIG. 8 is a diagram for describing touch operation and display operation according to the first embodiment of the present disclosure.

FIG. 6 is a block diagram schematically illustrating a touch display device according to a first embodiment of the present disclosure, FIG. 7 is a diagram for briefly describing a part of the touch display device according to the first embodiment of the present disclosure, and FIG. 8 is a diagram for describing touch operation and display operation according to the first embodiment of the present disclosure;

As illustrated in FIG. 6, the touch sensor 155 includes a plurality of touch electrodes TE and may be positioned in the display panel 150. The touch electrodes TE may be formed electrically in common with electrodes included in sub-pixels SP. The touch electrodes TE may be electrically connected to the touch driver (ROIC) 145 through touch sensing lines SL. One or more touch drivers 145 may be provided depending on the size of the touch sensor 155.

In one embodiment, the touch electrode TE is electrically in common with an electrode of the LED of the sub-pixel by being electrically connected to it via conductor, but at a different location than the specific physical location of the electrode of the LED. In a second embodiment, the touch electrode TE is electrically in common with an electrode of the LED of the sub-pixel by being the same integral conductive member. In this embodiment, it is the same integral, physical electrode, but has an extended size beyond the size required to perform solely the function of the electrode of LED. Thus, one portion is positioned to be most useful as the electrode of the LED and the other, integral, contiguous portion is positioned to be most useful as a touch electrode during a touch sensing period. In a third embodiment, the touch electrode TE is electrically in common with an electrode of the LED of the sub-pixel by being the exact same electrode having the position and shape to be an electrode for the LED and also being positioned to act at as the touch electrode TE during a touch operation, when the emission control transistor is in the turn-off state. In the third embodiment, the same physical electrode positioned and shaped solely as to act as the LED electrode during a turn-on state of the light emission transistor will also function as the touch electrode during a touch operation. In all three of the embodiments, the touch electrode TE is electrically in common with the electrode of the LED. In the first embodiment, they can be two distinct conductors at different locations and at different levels, but are electrically in common by being electrically coupled together, such by a via or other linking conductor. In the second embodiment, they are the same integral, contiguous member, having one portion positioned adjacent to the light emitting material and another portion positioned to a location to act as a touch electrode TE. In the second embodiment, they can be on the same semiconductor level form as a single contiguous member, or can be on different levels from each other, but still formed as a single contiguous member. In the third embodiment, the electrode is positioned adjacent to the light emitting layers of the LED only and in this position, it acts during a first period of time as an electrode to the LED and during a second period of time acts a touch electrode TE of the touch sensor.

As illustrated in FIG. 7 and FIG. 8, a single sub-pixel SP may be connected to the first power line EVDD, the second power line EVSS, the first data line DL1, and the first gate line GL1. A single sub-pixel SP may include an organic light-emitting diode (OLED) for emitting light.

A single sub-pixel SP may receive a data voltage for grayscale expression in order to emit light for a display operation period and receive a black data voltage for touch sensing without emitting light for a touch operation period, but the present disclosure is not limited thereto. For example, the black data voltage may not be applied according to a driving method.

The touch driver (ROIC) 145 may include a pre-amplifier AMP, a feedback capacitor Cfb, and a sensing channel SCH. A non-inverting terminal (+) of the pre-amplifier AMP may be connected to a line through which a touch driving voltage VIN is transferred and an inverting terminal (−) thereof may be connected to the sensing channel SCH. One end of the feedback capacitor Cfb may be connected to the inverting terminal (−) of the pre-amplifier AMP and the other end thereof may be connected to an output terminal VOUT of the pre-amplifier AMP. The touch driver (ROIC) 145 may be connected to a touch sensing line SL through the sensing channel SCH.

The touch driver (ROIC) 145 may acquire a touch sensing value from a touch electrode TE included in a single sub-pixel SP through the sensing channel SCH, integrate and sample the touch sensing value, generate touch raw data by which presence or absence of touch or touch position information can be determined, and output the raw touch data.

After a touch operation period according to the touch electrodes TE and the touch driver 145, a display operation period in which a data voltage is applied to sub-pixels SP to cause OLEDs to emit light and display an image may be present.

An example in which the touch operation period and the display operation period are generated once for one frame period is illustrated. However, the touch operation period and the display operation period may be alternately generated twice or more according to touch sensing methods and display driving methods.

Although an example in which the touch operation period and the display operation period are generated at a one to one ratio is illustrated, a ratio of generation thereof may depend on a touch sensing method and a display driving method.

Figure 9:
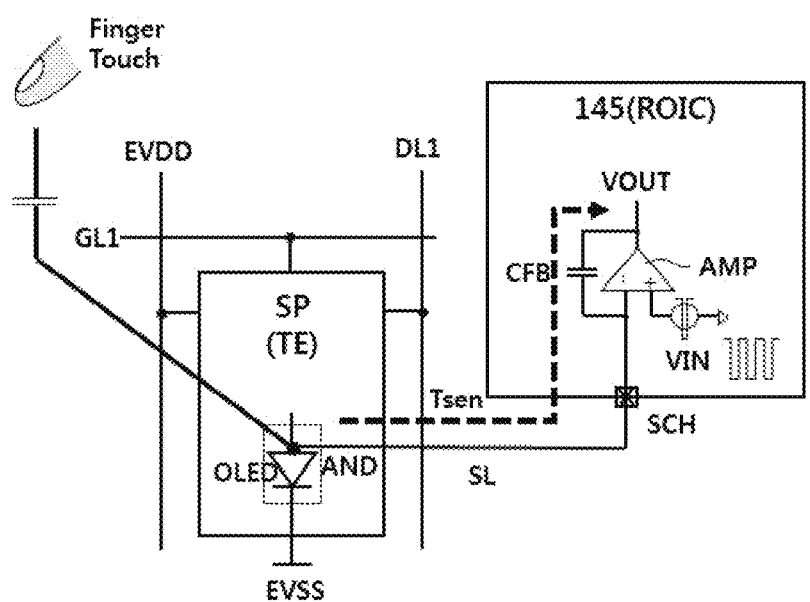
FIG. 9 is a diagram illustrating a touch electrode and a touch driver according to the first embodiment of the present disclosure.
Figure 10:
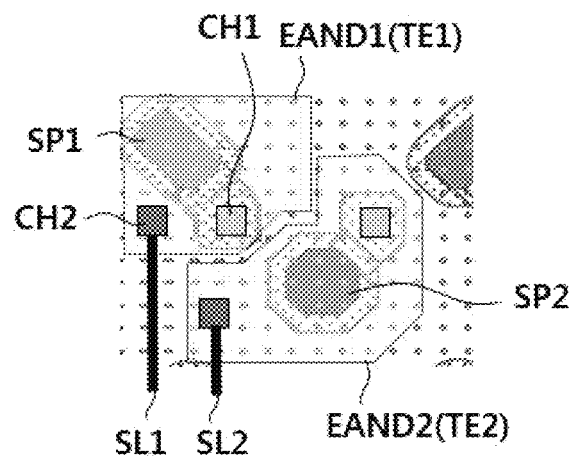
FIG. 10, FIG. 11A and FIG. 11B are diagrams for briefly describing a structure of the touch electrode.

FIG. 9 is a diagram illustrating a touch electrode and a touch driver according to the first embodiment of the present disclosure and FIG. 10 and FIG. 11 are diagrams for briefly describing a structure of the touch electrode.

As illustrated in FIG. 9, the touch electrode TE may be formed electrically in common with an anode AND of an organic light-emitting diode OLED included in a sub-pixel SP. The anode AND of the organic light-emitting diode OLED may serve as a touch electrode TE for a turn-off period of an emission control transistor. A touch sensing line SL may electrically connect the anode AND of the organic light-emitting diode OLED to a sensing channel SCH of the touch driver 145. The emission control transistor will have a turn-on period, during which mode the OLED can emit light, and a turn-off period during which the OLED cannot emit light. When finger touch according to a user is applied for a touch operation period, the touch driver 145 may obtain a touch sensing value Tsen with respect to variation in a feedback capacitor Cfb from the anode AND of the organic light-emitting diode OLED.

As illustrated in FIG. 10, a first sub-pixel SP1 and a second sub-pixel SP2 may have extended anodes EAND including a first extended anode EAND1 and a second extended anode EAND2. In the first sub-pixel SP1, the first extended anode EAND1 may be defined as an anode having a wider area than a conventional anode in order to serve as a first touch electrode TE1.

In the first sub-pixel SP1, the first extended anode EAND1 may be electrically connected to an electrode of a driving transistor through a first contact hole CH1 like a conventional anode. In addition, the first extended anode EAND1 may be electrically connected to the sensing channel SCH of the touch driver by being connected to a first sensing line SL1 through a second contact hole CH2.

Referring to the above description, the sub-pixels of the display panel have extended anodes EAND. The touch driver may obtain touch sensing values through sensing lines connected to the extended anodes EAND for a touch operation period.

Figure 11A:
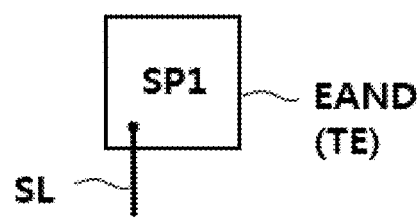

As illustrated in FIG. 11A, a touch electrode TE may be formed electrically in common with an extended anode EAND included in a first sub-pixel SP1. The extended anode EAND may be connected to a single sensing line SL.

Figure 11B:
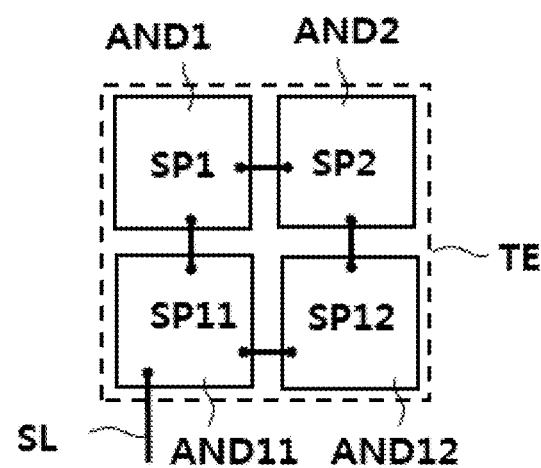

As illustrated in FIG. 11B, a touch electrode TE may be formed electrically in common with first to fourth anodes AND1 to AND4 included in first to fourth sub-pixels SP1 to SP4. The first to fourth anodes AND1 to AND4 may be connected to a single sensing line SL.

As can be ascertained from FIGS. 11A and 11B, a single touch electrode TE may be formed electrically in common with an extended anode EAND included in a single sub-pixel or electrically in common with anodes AND1 to AND4 included in a plurality of sub-pixels.

In the case of a structure in which the first to fourth anodes AND1 to AND4 included in the four sub-pixels SP1 to SP4 are electrically connected, as illustrated in FIG. 11B, a single touch electrode TE may be formed electrically in common with anodes that are not extended. However, this is merely an example and a single touch electrode TE may also be formed electrically in common with extended anodes EAND in the structure illustrated in FIG. 11B.

Accordingly, a single touch electrode TE may be formed electrically in common with an anode included in a single sub-pixel or anodes included in a plurality of sub-pixels in consideration of touch sensing sensitivity or resolution.

When a touch sensor is formed electrically in common with the anode of an organic light-emitting diode OLED included in a sub-pixel as in the first embodiment of the present disclosure, the thickness of a touch display device can be decreased and the number of manufacturing processes and manufacturing cost of a display panel having the touch sensor can be reduced.

Hereinafter, additional embodiments for realizing a touch sensor electrically in common with the anode of an OLED included in a sub-pixel as in the first embodiment of the present disclosure will be described. Although an example in which a single sub-pixel is composed of seven p-type transistors, a single capacitor, and a single OLED will be described below, the present disclosure is not limited thereto.

Figure 12:
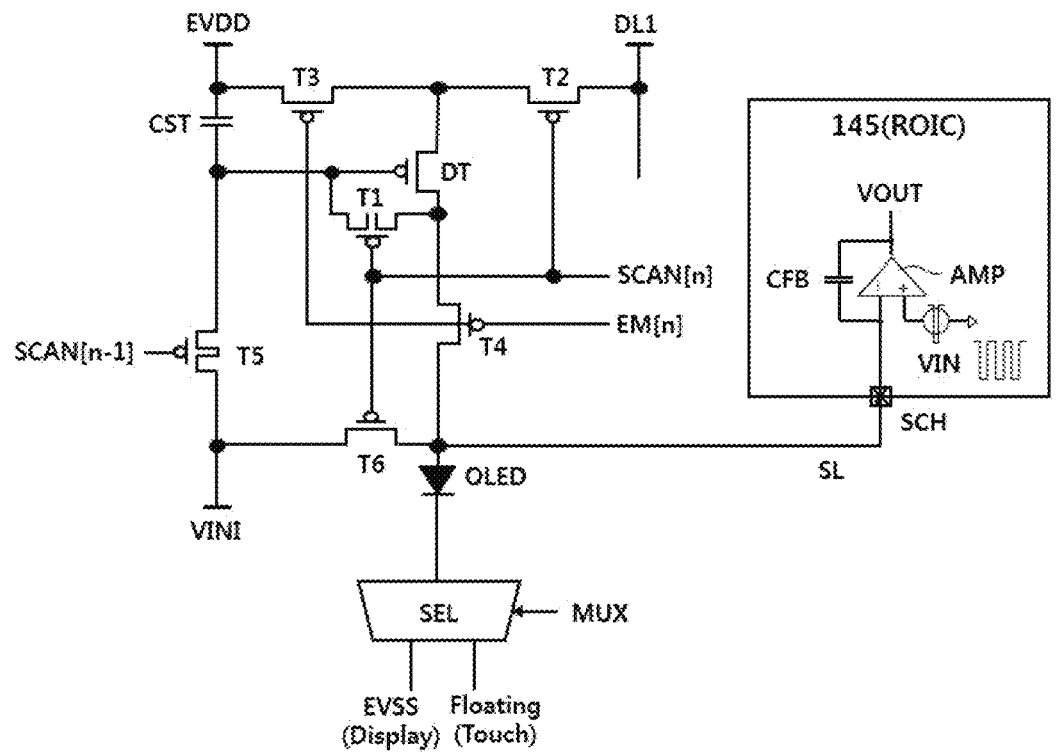
FIG. 12 is a diagram illustrating a touch electrode and a touch driver according to a second embodiment of the present disclosure.
Figure 13:
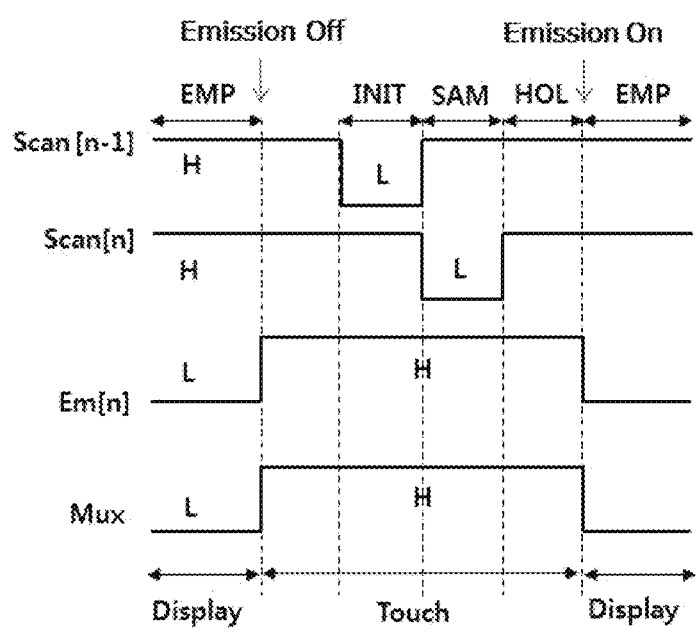
FIG. 13 is a waveform diagram for describing a driving method according to the second embodiment of the present disclosure.
Figure 14:
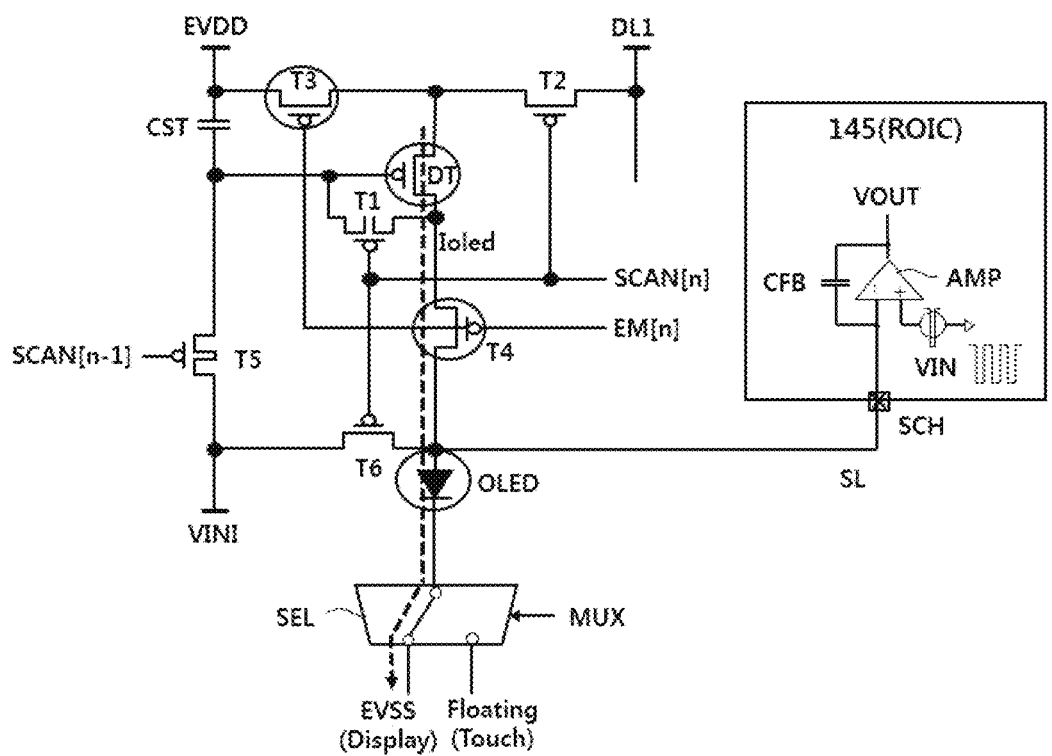
FIG. 14 and FIG. 15 are diagrams illustrating operations of the touch electrode and the touch driver according to the second embodiment of the present disclosure.
Figure 15:
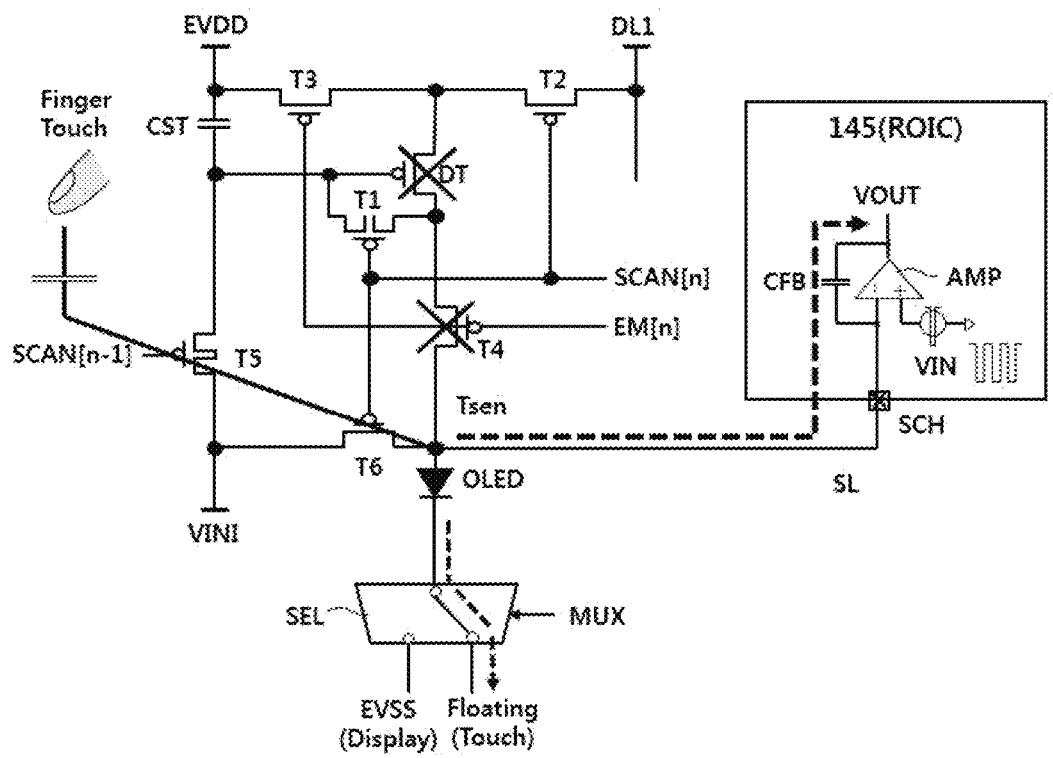

FIG. 12 is a diagram illustrating a touch electrode and a touch driver according to a second embodiment of the present disclosure, FIG. 13 is a waveform diagram for describing a driving method according to the second embodiment of the present disclosure, and FIG. 14 and FIG. 15 are diagrams illustrating operations of the touch electrode and the touch driver according to the second embodiment of the present disclosure.

As illustrated in FIG. 12 and FIG. 13, a single sub-pixel may include a first transistor T1, a second transistor T2, a third transistor T3, a fourth transistor T4, a fifth transistor T5, a sixth transistor T6, a capacitor CST, a driving transistor DT, and an organic light-emitting diode OLED.

The first transistor T1 may have a gate electrode connected to an N-th scan line SCAN[n], a first electrode connected to a second electrode of the driving transistor DT, and a second electrode connected to a gate electrode of the driving transistor DT. The first transistor T1 may serve to electrically connect (diode-connect) the gate electrode and the second electrode of the driving transistor DR and transfer a data voltage transmitted through the second transistor T2 to one end of the capacitor CST in response to an N-th scan signal Scan[n] applied through the N-th scan line SCAN[n].

The second transistor T2 may have a gate electrode connected to the N-th scan line SCAN[n], a first electrode connected to a first data line DL1, and a second electrode connected to the first electrode of the driving transistor DT and a first electrode of the third transistor T3. The second transistor T2 may serve to output a data voltage transmitted through the first data line DL1 in response to the N-th scan signal Scan[n] applied through the scan line SCAN[n].

The third transistor T3 may have a gate electrode connected to an N-th emission control line EM[n], the first electrode connected to the first electrode of the driving transistor DT and the second electrode of the second transistor T2, and a second electrode connected to the other end of the capacitor CST. The third transistor T3 may serve to transfer first power transmitted through the first power line EVDD to the first electrode of the driving transistor DT in response to an N-th emission control signal Em[n] applied through the N-th emission control line EM[n].

The fourth transistor T4 may have a gate electrode connected to the N-th emission control line EM[n], a first electrode connected to the second electrode of the driving transistor DT, and a second electrode connected to the anode of the organic light-emitting diode OLED and a first electrode of the sixth transistor T6. The fourth transistor T4 may serve to transfer a driving current generated from the driving transistor DT to the anode of the organic light-emitting diode OLED in response to the N-th emission control signal Em[n] applied through the N-th emission control line EM[n]. That is, the fourth transistor T4 is an emission control transistor that controls emission of the organic light-emitting diode OLED. The emission control transistor T4 will have time period in which it is turn-on, during which time the OLED can be driven to emit light. The emission control transistor T4 will have a time period in which it is turned off, during which time the OLED is not driven to emit light. During the period when the emission control period is turned off, the electrode that is electrically in common with the OLED electrode is put into a sense mode and acts as a touch sensor electrode for a touch sensing operation.

The fifth transistor T5 may have a gate electrode connected to an (N−1)-th scan line SCAN[N−1], a first electrode connected to one end of the capacitor CST and the gate electrode of the driving transistor DT, and a second electrode connected to an initialization voltage line VINI. The fifth transistor T5 may serve to transfer an initialization voltage transmitted through the initialization voltage line VINI to one end of the capacitor CST and the gate electrode of the driving transistor DT in response to an (N−1)-th scan signal Scan[n−1] applied through the (N−1)-th scan line SCAN[n−1].

The sixth transistor T6 may have a gate electrode connected to the N-th scan line SCAN[n], the first electrode connected to the second electrode of the fourth transistor T4 and the anode of the organic light-emitting diode OLED, and a second electrode connected to the initialization voltage line VINI. The sixth transistor T6 may serve to transfer the initialization voltage transmitted through the initialization voltage line VINI to the anode of the organic light-emitting diode OLED in response to the N-th scan signal Scan[n] applied through the N-th scan line SCAN[n].

One end of the capacitor CST may be connected to the gate electrode of the driving transistor DT, the second electrode of the first transistor T1, and the second electrode of the fifth transistor T5, and the other end of the capacitor CST may be connected to the first power line EVDD and the second electrode of the third transistor T3. The capacitor CST may serve to store a data voltage and transfer the stored data voltage to the gate electrode of the driving transistor.

The gate electrode of the driving transistor DT may be connected to one end of the capacitor CST and the second electrode of the first transistor T1, the first electrode of the driving transistor DT may be connected to the second electrode of the second transistor T2 and the first electrode of the third transistor T3, and the second electrode of the driving transistor DT may be connected to the first electrode of the first transistor T1 and the first electrode of the fourth transistor T4. The driving transistor DT may serve to generate a driving current in response to a data voltage stored in the capacitor CST.

The anode of the organic light-emitting diode OLED may be connected to the second electrode of the fourth transistor T4 and the first electrode of the sixth transistor T6, and the cathode of the organic light-emitting diode OLED may be connected to an input terminal of a selector SEL. The organic light-emitting diode OLED may serve to emit light based on the driving current from the driving transistor DT.

The selector SEL may be included in a sub-pixel or provided outside the sub-pixel. The outside of a sub-pixel may mean a non-emission area included in a display area of the display panel and a non-display area positioned outside the display area. The selector SEL may connect the cathode of the organic light-emitting diode OLED to the second power line EVSS or cause the cathode of the organic light-emitting diode OLED to electrically float in response to a select signal Mux applied through a select signal line MUX.

The touch driver 145 may include a pre-amplifier AMP, a feedback capacitor Cfb, and a sensing channel SCH. The touch driver 145 may be electrically connected to the anode of the organic light-emitting diode OLED through a touch sensing line SL connected to the sensing channel SCH.

A single sub-pixel may operate in an initialization period INIT, a sampling period SAM, a hold period HOL, and an emission period EMP.

The fifth transistor T5 may be turned on by the (N−1)-th scan signal Scan[n−1] for the initialization period INIT. One end of the capacitor CST and the gate electrode (gate node) of the driving transistor DT may be initialized according to the turned on fifth transistor T5

The first transistor T1 and the second transistor T2 may be turned on by the N-th scan signal Scan[n] for the sampling period SAM. An operation of sampling the threshold voltage of the driving transistor DT may be performed according to the turned on first and second transistors T1 and T2. The capacitor CST may store a data voltage in which the threshold voltage of the driving transistor DT has been compensated.

All the transistors may be turned off for the hold period HOL. The hold period HOL is a period (voltage maintaining period) for stabilizing the sampling operation and data voltage storing operation performed in the sampling period SAM. The hold period HOL may be omitted according to a driving method.

The third transistor T3 and the fourth transistor T4 may be turned on by the N-th emission control signal Em[n] for the emission period EMP. The driving transistor DT may generate a driving current according to the turned on third and fourth transistors T3 and T4. In addition, the organic light-emitting diode OLED may emit light based on the driving current Ioled.

As illustrated in FIG. 13 and FIG. 14, the third transistor T3, the driving transistor DT, and the fourth transistor T4 may be turned on for a display operation period Display. The selector SEL may connect the cathode of the organic light-emitting diode OLED to the second power line EVSS in response to the select signal Mux for the display operation period Display. Consequently, the organic light-emitting diode OLED may emit light based on the driving current Ioled transferred through the turned on fourth transistor T4 for the display operation period Display.

As illustrated in FIG. 13 and FIG. 15, the driving transistor DT and the fourth transistor T4 may be turned off for a touch operation period Touch. The selector SEL may cause the cathode of the organic light-emitting diode OLED to electrically float in response to the select signal Mux for the touch operation period Touch. Consequently, the touch driver 145 may obtain a touch sensing value Tsen through the anode of the organic light-emitting diode OLED for the touch operation period Touch.

Since the anode of the organic light-emitting diode OLED serves as a touch electrode for the touch operation period Touch, as described above, it can receive and sense user input in the form of touch.

The emission period EMP of the organic light-emitting diode OLED may start (Emission On) at the time of transition of the N-th emission control signal Em[n] from a logic high level H to a logic low level L and may end (Emission Off) at the time of transition from the logic low level L to the logic high level H. Accordingly, the touch operation period Touch may correspond to a period in which the N-th emission control signal Em[n] maintains the logic high level H.

Accordingly, an example in which the cathode of the organic light-emitting diode OLED is caused to electrically float in the period in which the select signal Mux or the N-th emission control signal Em[n] maintains the logic high level H has been described. However, the cathode of the organic light-emitting diode OLED may be configured such that it electrically floats when the select signal Mux is at the logic low level instead of the logic high level H.

Figure 16:
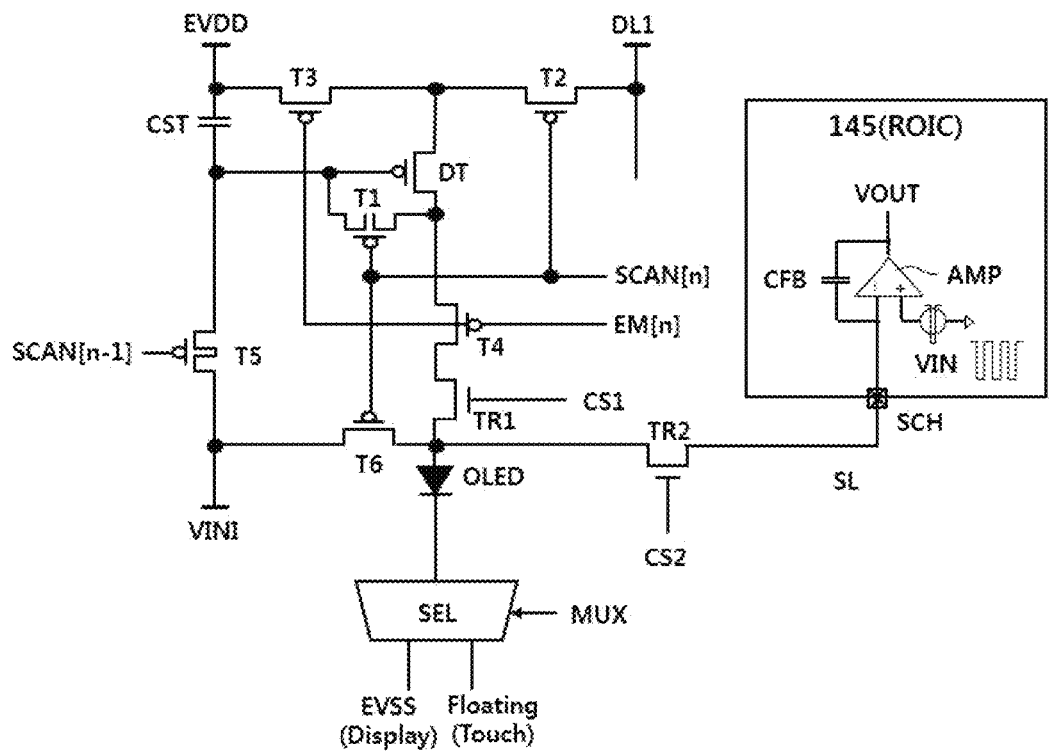
FIG. 16 is a diagram illustrating a touch electrode and a touch driver according to a third embodiment of the present disclosure.
Figure 17:
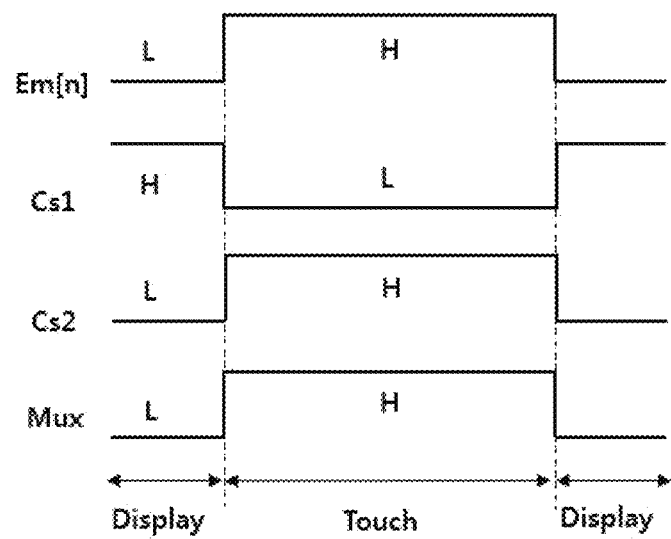
FIG. 17 is a waveform diagram for describing a driving method according to the third embodiment of the present disclosure.

FIG. 16 is a diagram illustrating a touch electrode and a touch driver according to a third embodiment of the present disclosure and FIG. 17 is a waveform diagram for describing a driving method according to the third embodiment of the present disclosure. Hereinafter, the third embodiment of the present disclosure, which is modified from the second embodiment, will be described focusing on parts modified from the second embodiment.

As illustrated in FIG. 16 and FIG. 17, a single sub-pixel may further include a first n-type control transistor TR1 and a second n-type control transistor TR2. The first control transistor TR1 may be disposed between the fourth transistor T4 and the anode of the organic light-emitting diode OLED. The second control transistor TR2 may be disposed between the anode of the organic light-emitting diode OLED and the sensing channel SCH of the touch driver 145.

The first control transistor TR1 may have a gate electrode connected to a first node control signal line CS1, a first electrode connected to the second electrode of the fourth transistor T4, and a second electrode connected to the anode of the organic light-emitting diode OLED, the first electrode of the sixth transistor T6, and the second electrode of the second control transistor TR2.

The first control transistor TR1 may be turned on for the display operation period Display and turned off for the touch operation period Touch. For this, a first node control signal Cs1 transmitted through the first node control signal line CS1 may be applied at a logic high level H for the display operation period Display and applied at a logic low level L for the touch operation period Touch.

The second control transistor TR2 may have a gate electrode connected to a second node control signal line CS2, a first electrode connected to a touch sensing line SL, and a second electrode connected to the anode of the organic light-emitting diode OLED, the first electrode of the sixth transistor T6, and the second electrode of the first control transistor TR1.

The second control transistor TR2 may be turned off for the display operation period Display and turned on for the touch operation period Touch. For this, a second node control signal Cs2 transmitted through the second node control signal line CS2 may be applied at a logic low level L for the display operation period Display and applied at a logic high level H for the touch operation period Touch.

Accordingly, the first control transistor TR1 can improve electrical independence of the anode of the organic light-emitting diode OLED, which serves as a touch electrode, by being turned off for the touch operation period Touch, and the second control transistor TR2 can prevent leakage when the sub-pixel emits light by being turned off for the display operation period Display. That is, the first control transistor TR1 and the second control transistor TR2 can improve operation independence (display operation and touch operation) of the display device during operations in the display operation period Display and the touch operation period Touch.

Figure 18:
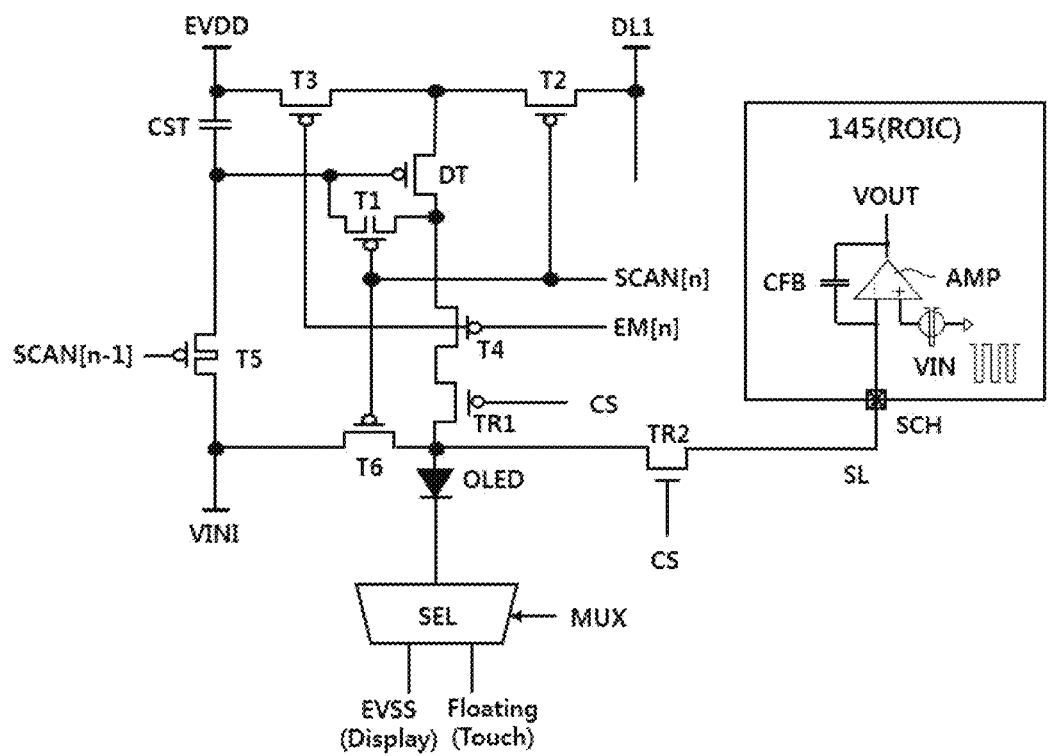
FIG. 18 is a diagram illustrating a touch electrode and a touch driver according to a fourth embodiment of the present disclosure.
Figure 19:
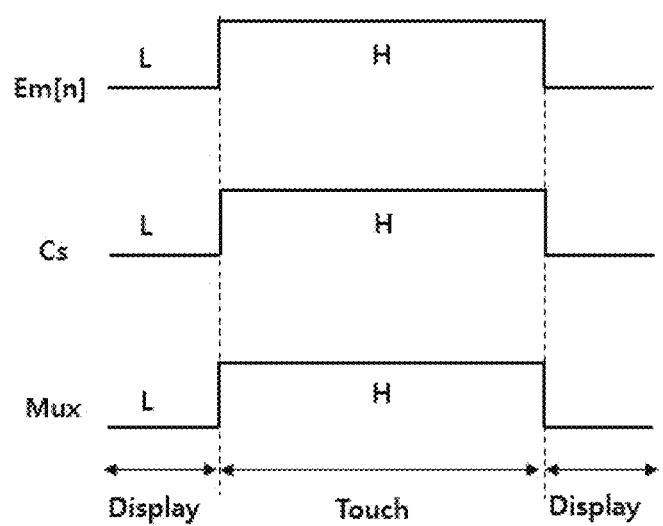
FIG. 19 is a waveform diagram for describing a driving method according to the fourth embodiment of the present disclosure.

FIG. 18 is a diagram illustrating a touch electrode and a touch driver according to a fourth embodiment of the present disclosure and FIG. 19 is a waveform diagram for describing a driving method according to the fourth embodiment of the present disclosure. Hereinafter, the fourth embodiment of the present disclosure, which is modified from the third embodiment, will be described focusing on parts modified from the third embodiment.

As illustrated in FIG. 18 and FIG. 19, a single sub-pixel may further include a first p-type control transistor TR1 and a second n-type control transistor TR2. The first control transistor TR1 may be disposed between the fourth transistor T4 and the anode of the organic light-emitting diode OLED. The second control transistor TR2 may be disposed between the anode of the organic light-emitting diode OLED and the sensing channel SCH of the touch driver 145.

The first control transistor TR1 may have a gate electrode connected to a node control signal line CS, a first electrode connected to the second electrode of the fourth transistor T4, and a second electrode connected to the anode of the organic light-emitting diode OLED, the first electrode of the sixth transistor T6, and the second electrode of the second control transistor TR2.

The second control transistor TR2 may have a gate electrode connected to the node control signal line CS, a first electrode connected to a touch sensing line SL, and a second electrode connected to the anode of the organic light-emitting diode OLED, the first electrode of the sixth transistor T6, and the second electrode of the first control transistor TR1.

The first control transistor TR1 may be turned on for the display operation period Display and turned off for the touch operation period Touch. The second control transistor TR2 may be turned off for the display operation period Display and turned on for the touch operation period Touch.

A node control signal Cs transmitted through the node control signal line CS may be applied at a logic low level L for the display operation period Display and applied at a logic high level H for the touch operation period Touch. Accordingly, when the first control transistor TR1 is configured as a p-type transistor and the second control transistor TR2 is configured as an n-type transistor, the two transistors TR1 and TR2 can share the single node control signal line CS, and thus disadvantages due to increase in the number of signal lines and difficulty of design due to arrangement of signal lines can be overcome.

Figure 20:
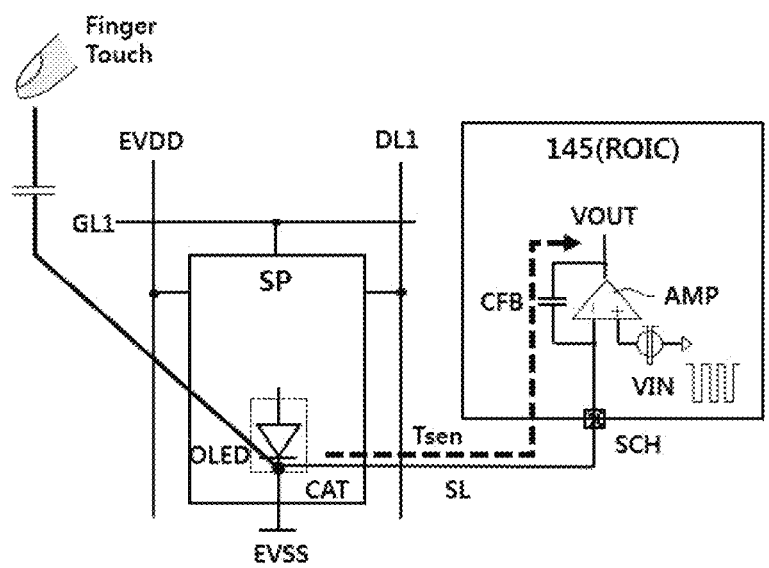
FIG. 20 is a diagram illustrating a touch electrode and a touch driver according to a fifth embodiment of the present disclosure.
Figure 21:
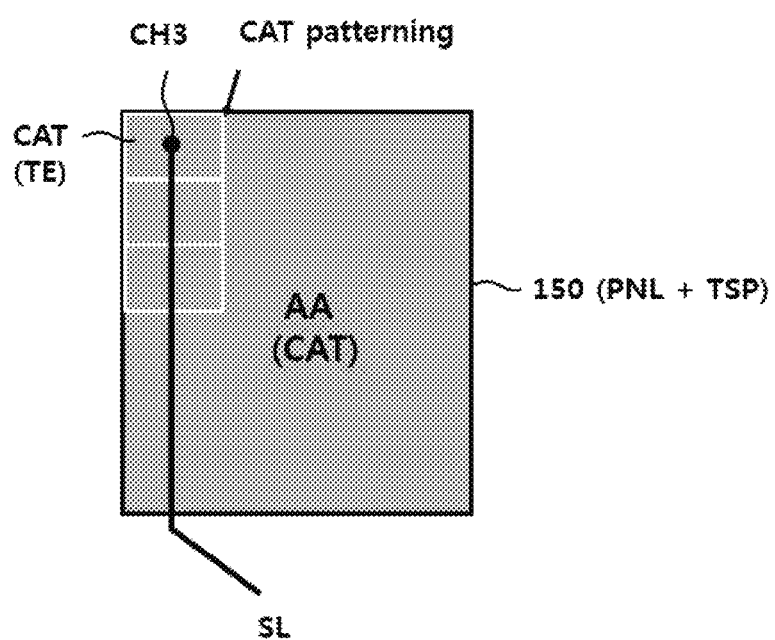
FIG. 21, FIG. 22A and FIG. 22B are diagrams for briefly describing a structure of the touch electrode.

FIG. 20 is a diagram illustrating a touch electrode and a touch driver according to a fifth embodiment of the present disclosure and FIG. 21 and FIG. 22 are diagrams for briefly describing a structure of the touch electrode.

As illustrated in FIG. 20, in this embodiment, the touch electrode TE may be formed electrically in common with a cathode CAT of an organic light-emitting diode OLED included in a sub-pixel SP. The cathode CAT of the organic light-emitting diode OLED may serve as a touch electrode TE for a turn-off period of an emission control transistor. A touch sensing line SL may electrically connect the cathode CAT of the organic light-emitting diode OLED and a sensing channel SCH of the touch driver 145.

When finger touch according to a user is applied for a touch operation period, the touch driver 145 may obtain a touch sensing value Tsen with respect to variation in a feedback capacitor Cfb from the cathode CAT of the organic light-emitting diode OLED.

As illustrated in FIG. 21, the cathode CAT is formed to cover an entire display area AA of a display panel (PNL) 150 having a touch sensor TSP, but it may be isolated into touch electrodes TE according to cathode isolation. The isolated touch electrodes TE may be electrically connected to the sensing channel of the touch driver by being connected to a first sensing line SL1 through a third contact hole CH3.

Referring to the above description, sub-pixels of the display panel have isolated cathodes. The touch driver may obtain touch sensing values through sensing lines connected to the isolated cathodes for a touch operation period.

Figure 22A:
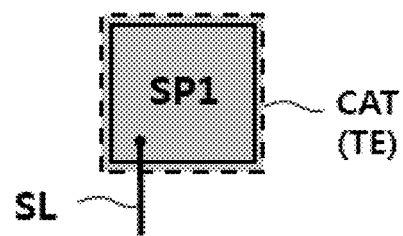

As illustrated in FIG. 22A, a touch electrode TE may be included in a first sub-pixel SP1 and formed electrically in common with a cathode CAT isolated from other cathodes. The isolated cathode CAT may be connected to a single sensing line SL. That is, the touch electrode TE may correspond to the size (e.g., area) of the first sub-pixel SP1.

Figure 22B:
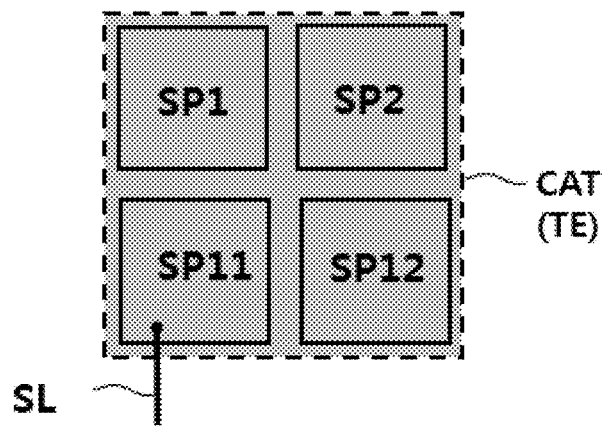

As illustrated in FIG. 22B, a touch electrode TE may be included in first to fourth sub-pixels SP1 to SP4 and formed electrically in common with a cathode CAT isolated from other cathodes. The isolated cathode CAT may be connected to a single sensing line SL. That is, the touch electrode TE may correspond to the size (e.g., area) of the first to fourth sub-pixels SP1 to SP4.

When a touch sensor is configured electrically in common with the cathode of an organic light-emitting diode include in a sub-pixel as in the fifth embodiment of the present disclosure, as described above, the thickness of a touch display device can be decreased and the number of manufacturing processes and manufacturing cost of a display panel having the touch sensor can be reduced.

Hereinafter, additional embodiments for realizing a touch sensor electrically in common with the cathode of an OLED included in a sub-pixel as in the first embodiment of the present disclosure will be described. Although an example in which a single sub-pixel is composed of seven p-type transistors, a single capacitor, and a single OLED will be described below, the present disclosure is not limited thereto.

Figure 23:
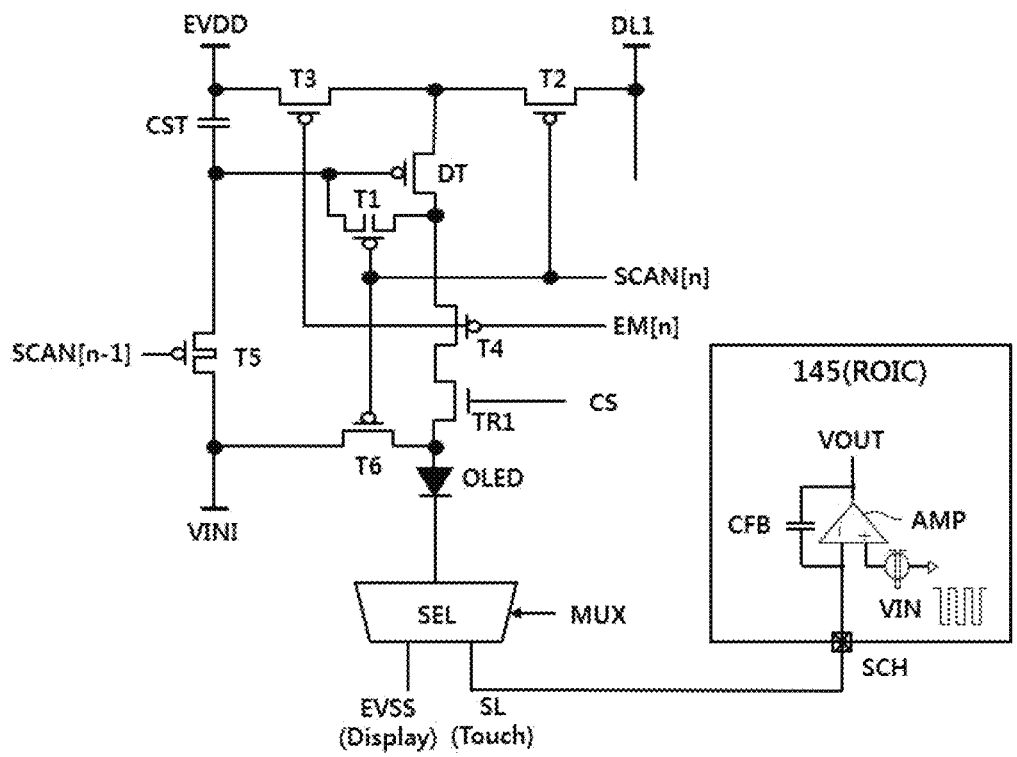
FIG. 23 is a diagram illustrating a touch electrode and a touch driver according to a sixth embodiment of the present disclosure.
Figure 24:
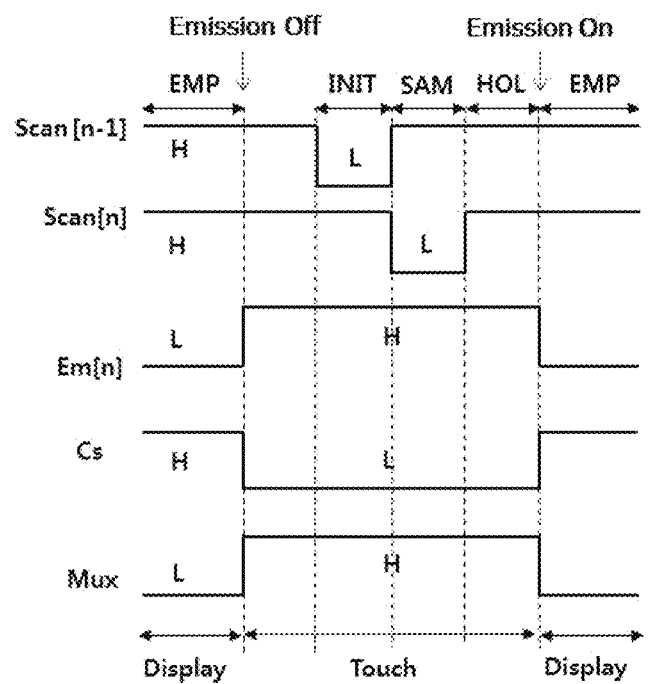
FIG. 24 is a waveform diagram for describing a driving method according to the sixth embodiment of the present disclosure.
Figure 25:
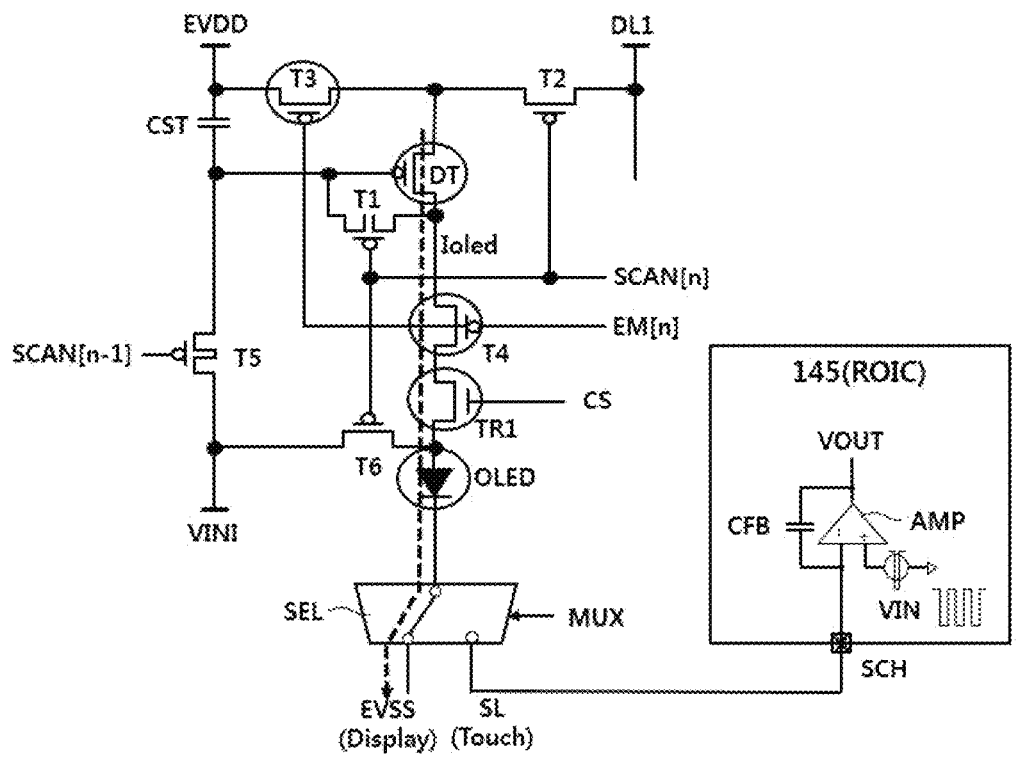
FIG. 25 and FIG. 26 are diagrams illustrating operations of the touch electrode and the touch driver according to the sixth embodiment of the present disclosure.
Figure 26:
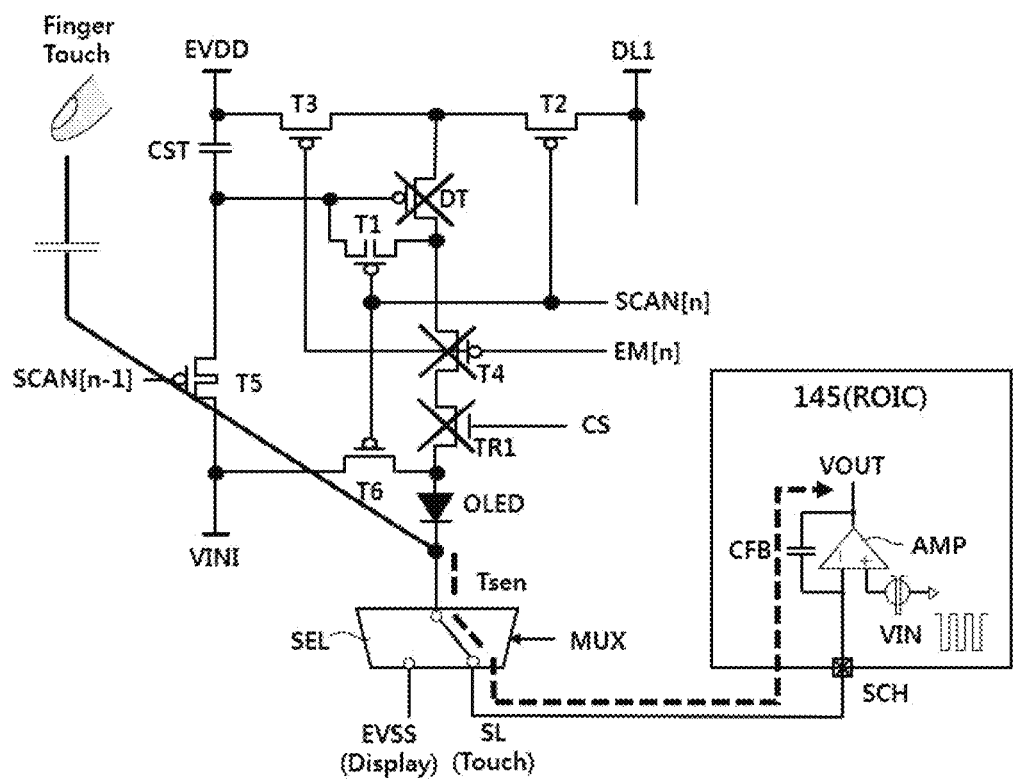

FIG. 23 is a diagram illustrating a touch electrode and a touch driver according to a sixth embodiment of the present disclosure, FIG. 24 is a waveform diagram for describing a driving method according to the sixth embodiment of the present disclosure, and FIG. 25 and FIG. 26 are diagrams illustrating operations of the touch electrode and the touch driver according to the sixth embodiment of the present disclosure.

As illustrated in FIG. 23 and FIG. 24, a single sub-pixel may include a first transistor T1, a second transistor T2, a third transistor T3, a fourth transistor T4, a fifth transistor T5, a sixth transistor T6, a capacitor CST, a driving transistor DT, a first control transistor TR1, and an organic light-emitting diode OLED.

The first control transistor TR1 may be configured as an n-type transistor differently from other transistors. Components and connection relations thereof in the sub-pixel according to the sixth embodiment differ from those in the above-described second embodiment in that the first control transistor TR1 is additionally provided between the fourth transistor T4 and the organic light-emitting diode OLED. Accordingly, only parts with respect to the fourth transistor T4, the first control transistor TR1, and the organic light-emitting diode OLED will be additionally described.

The fourth transistor T4 may have a gate electrode connected to the N-th emission control line EM[n], a first electrode connected to the second electrode of the driving transistor DT, and a second electrode connected to the first electrode of the first control transistor TR1. The fourth transistor T4 may serve to transfer a driving current generated from the driving transistor DT to the first electrode of the fourth transistor T4 in response to the N-th emission control signal Em[n] applied through the N-th emission control line EM[n]. That is, the fourth transistor T4 is an emission control transistor that controls emission of the organic light-emitting diode OLED.

The first control transistor TR1 may have a gate electrode connected to a node control signal line CS, a first electrode connected to the second electrode of the fourth transistor T4, and a second electrode connected to the anode of the organic light-emitting diode OLED and the first electrode of the sixth transistor T6. The first control transistor TR1 may serve to transfer the driving current transferred from the fourth transistor T4 to the anode of the organic light-emitting diode OLED for a display operation period. To this end, the first control transistor TR1 may be turned on for the display operation period and turned off for the touch operation period.

The anode of the organic light-emitting diode OLED may be connected to the second electrode of the first control transistor TR1 and the first electrode of the sixth transistor T6, and the cathode of the organic light-emitting diode OLED may be connected to an input terminal of a selector SEL. The organic light-emitting diode OLED may serve to emit light based on the driving current from the driving transistor DT.

The selector SEL may be included in the sub-pixel or provided outside the sub-pixel. The outside of the sub-pixel may mean a non-emission area included in the display area of the display panel and the non-display area positioned outside the display area. The selector SEL may connect the cathode of the organic light-emitting diode OLED to the second power line EVSS or a touch sensing line SL in response to a select signal Mux applied through a select signal line MUX.

The touch driver 145 may include a pre-amplifier AMP, a feedback capacitor Cfb, and a sensing channel SCH. The touch driver 145 may be electrically connected to the cathode of the organic light-emitting diode OLED through the touch sensing line SL connected to the sensing channel SCH.

A single sub-pixel may operate in an initialization period INIT, a sampling period SAM, a hold period HOL, and an emission period EMP.

The operations of the transistors included in the sub-pixel in the initialization period INIT, the sampling period SAM, the hold period HOL, and the emission period EMP are similar to those in the second embodiment. Accordingly, description will be given focusing on modified parts in the display operation period Display and the touch operation period Touch.

As illustrated in FIG. 24 and FIG. 25, the third transistor T3, the driving transistor DT, the fourth transistor T4, and the first control transistor TR1 may be turned on for the display operation period Display. The selector SEL may connect the cathode of the organic light-emitting diode OLED to the second power line EVSS in response to the select signal Mux for the display operation period Display. Consequently, the organic light-emitting diode OLED can emit light based on a driving current Ioled transferred through the turned on first control transistor TR1 for the display operation period Display.

As illustrated in FIG. 24 and FIG. 26, the driving transistor DT, the fourth transistor T4, and the first control transistor TR1 may be turned off for the touch operation period Touch. The selector SEL may connect the cathode of the organic light-emitting diode OLED to the touch sensing line SL in response to the select signal Mux for the touch operation period Touch. Consequently, the touch driver 145 can obtain a touch sensing value Tsen through the cathode of the organic light-emitting diode OLED for the touch operation period Touch.

As described above, the cathode of the organic light-emitting diode OLED serves as a touch electrode for the touch operation period Touch and thus can receive and sense user input in the form of touch.

The emission period EMP of the organic light-emitting diode OLED may start (Emission On) at the time of transition of the N-th emission control signal Em[n] from a logic high level H to a logic low level L and may end (Emission Off) at the time of transition from the logic low level L to the logic high level H. Accordingly, the touch operation period Touch may correspond to a period in which the N-th emission control signal Em[n] maintains the logic high level H.

Accordingly, an example in which the cathode of the organic light-emitting diode OLED is caused to electrically float in the period in which the select signal Mux or the N-th emission control signal Em[n] maintains the logic high level H has been described. However, the cathode of the organic light-emitting diode OLED may be configured such that it electrically floats when the select signal Mux is at the logic low level instead of the logic high level H.

In addition, although an example in which the node control signal Cs is generated at the logic high level H for the display operation period Display and generated at the logic low level L for the touch operation period Touch has been described, the present disclosure is not limited thereto. That is, an example, in which the node control signal Cs has a phase reverse to that of the N-th emission control signal Em[n] has been described, but the present disclosure is not limited thereto.

Figure 27:
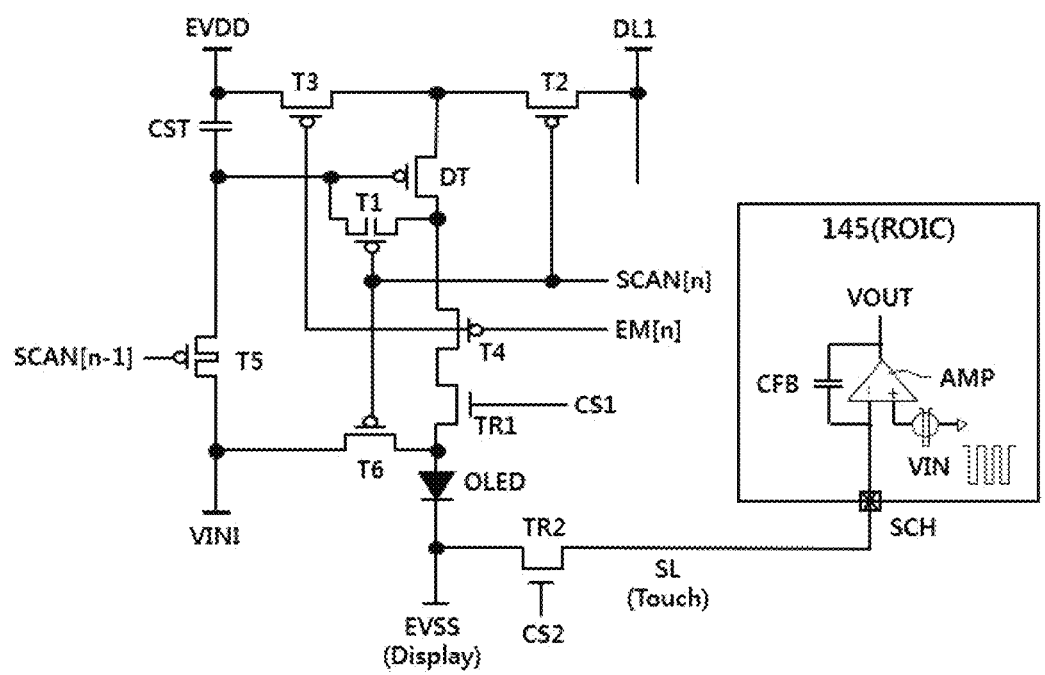
FIG. 27 is a diagram illustrating a touch electrode and a touch driver according to a seventh embodiment of the present disclosure.
Figure 28:
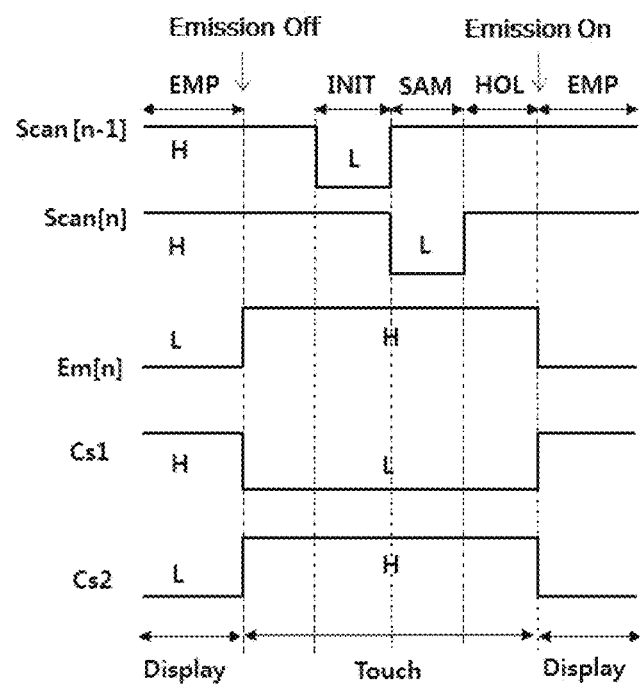
FIG. 28 is a waveform diagram for describing a driving method according to the seventh embodiment of the present disclosure.

FIG. 27 is a diagram illustrating a touch electrode and a touch driver according to a seventh embodiment of the present disclosure and FIG. 28 is a waveform diagram for describing a driving method according to the seventh embodiment of the present disclosure.

Hereinafter, the seventh embodiment of the present disclosure, which is modified from the sixth embodiment, will be described focusing on parts modified from the sixth embodiment.

As illustrated in FIG. 27 and FIG. 28, a single sub-pixel may further include a first n-type control transistor TR1 and a second n-type control transistor TR2. The first control transistor TR1 may be disposed between the fourth transistor T4 and the anode of the organic light-emitting diode OLED. The second control transistor TR2 may be disposed between the cathode of the organic light-emitting diode OLED and the sensing channel SCH of the touch driver 145.

The first control transistor TR1 may have a gate electrode connected to a first node control signal line CS1, a first electrode connected to the second electrode of the fourth transistor T4, and a second electrode connected to the anode of the organic light-emitting diode OLED and the first electrode of the sixth transistor T6.

The first control transistor TR1 may be turned on for the display operation period Display and turned off for the touch operation period Touch. For this, a first node control signal Cs1 transmitted through the first node control signal line CS1 may be applied at a logic high level H for the display operation period Display and applied at a logic low level L for the touch operation period Touch.

The second control transistor TR2 may have a gate electrode connected to a second node control signal line CS2, a first electrode connected to a touch sensing line SL, and a second electrode connected to the cathode of the organic light-emitting diode OLED.

The second control transistor TR2 may be turned off for the display operation period Display and turned on for the touch operation period Touch. For this, a second node control signal Cs2 transmitted through the second node control signal line CS2 may be applied at a logic low level L for the display operation period Display and applied at a logic high level H for the touch operation period Touch.

Figure 29:
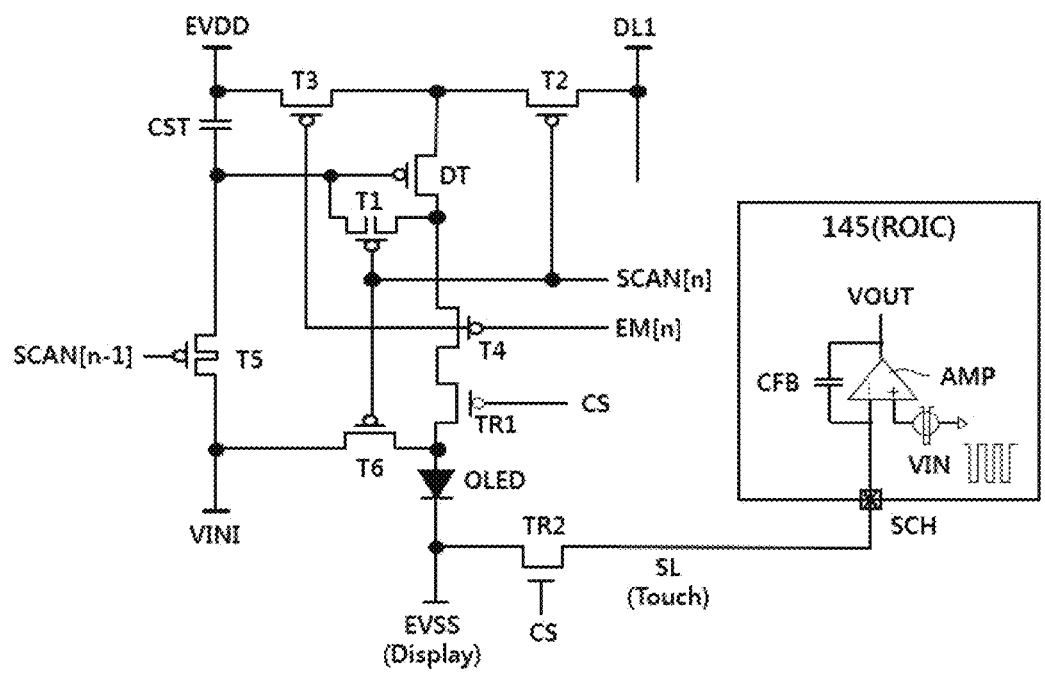
FIG. 29 is a diagram illustrating a touch electrode and a touch driver according to an eighth embodiment of the present disclosure.
Figure 30:
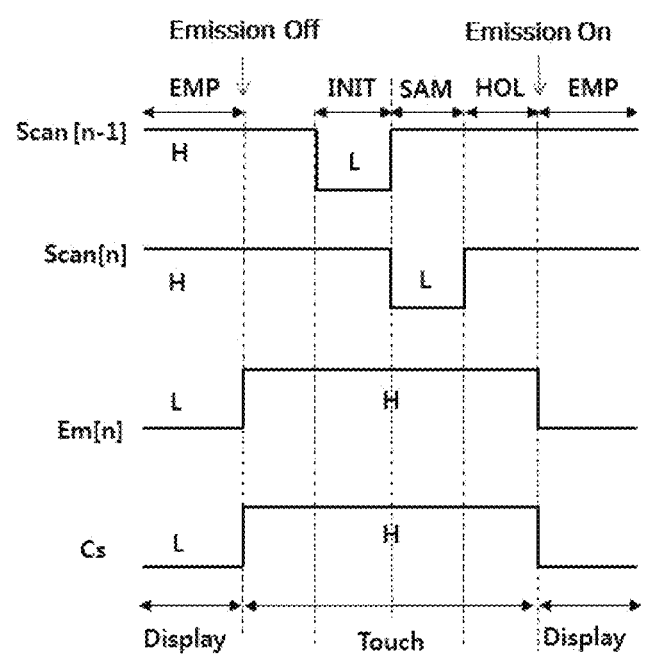
FIG. 30 is a waveform diagram for describing a driving method according to the eighth embodiment of the present disclosure.

FIG. 29 is a diagram illustrating a touch electrode and a touch driver according to an eighth embodiment of the present disclosure and FIG. 30 is a waveform diagram for describing a driving method according to the eighth embodiment of the present disclosure. Hereinafter, the eighth embodiment of the present disclosure, which is modified from the seventh embodiment, will be described focusing on parts modified from the seventh embodiment.

As illustrated in FIG. 29 and FIG. 30, a single sub-pixel may further include a first p-type control transistor TR1 and a second n-type control transistor TR2. The first control transistor TR1 may be disposed between the fourth transistor T4 and the anode of the organic light-emitting diode OLED. The second control transistor TR2 may be disposed between the cathode of the organic light-emitting diode OLED and the sensing channel SCH of the touch driver 145.

The first control transistor TR1 may have a gate electrode connected to a node control signal line CS, a first electrode connected to the second electrode of the fourth transistor T4, and a second electrode connected to the anode of the organic light-emitting diode OLED and the first electrode of the sixth transistor T6.

The second control transistor TR2 may have a gate electrode connected to the node control signal line CS, a first electrode connected to the touch sensing line SL, and a second electrode connected to the cathode of the organic light-emitting diode OLED.

The first control transistor TR1 may be turned on for the display operation period Display and turned off for the touch operation period Touch. The second control transistor TR2 may be turned off for the display operation period Display and turned on for the touch operation period Touch.

A node control signal Cs transmitted through the node control signal line CS may be applied at a logic low level L for the display operation period Display and applied at a logic high level H for the touch operation period Touch. Accordingly, when the first control transistor TR1 is configured as a p-type transistor and the second control transistor TR2 is configured as an n-type transistor, the two transistors TR1 and TR2 can share the single node control signal line CS, and thus disadvantages due to increase in the number of signal lines and difficulty of design due to arrangement of signal lines can be overcome.

Figure 31:
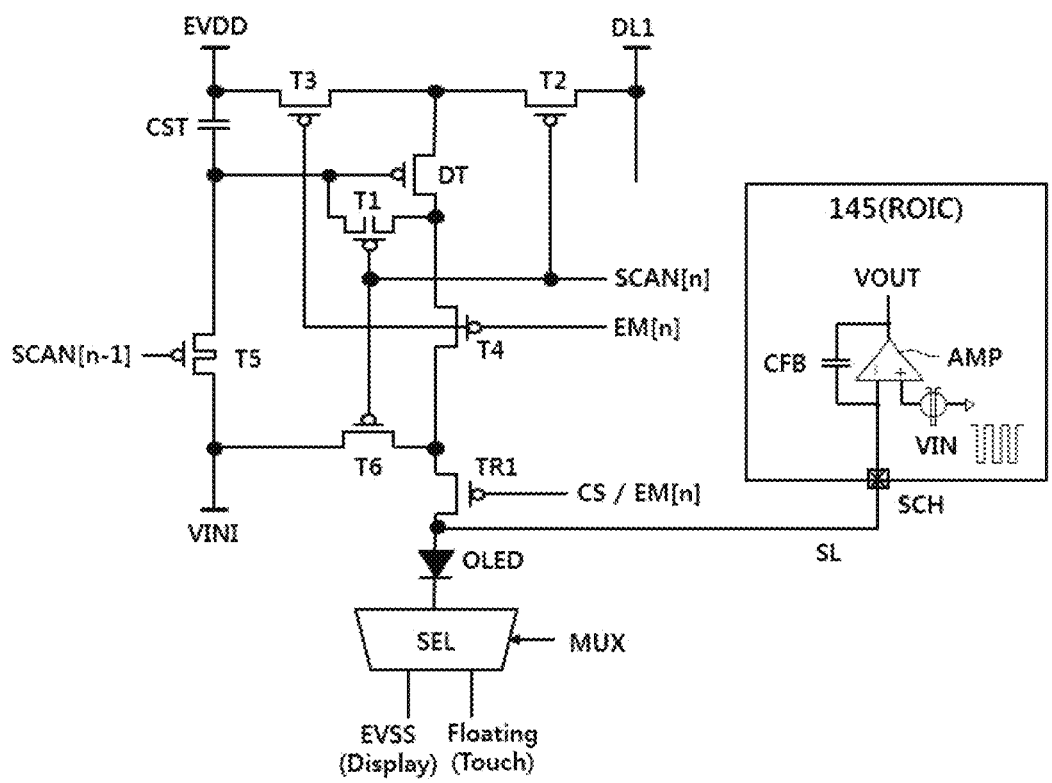
FIG. 31 is a diagram illustrating a touch electrode and a touch driver according to a ninth embodiment of the present disclosure.

FIG. 31 is a diagram illustrating a touch electrode and a touch driver according to a ninth embodiment of the present disclosure. Hereinafter, the ninth embodiment of the present disclosure, which is a modified embodiment referred to when the first to fourth embodiments are realized, will be described focusing on parts modified from the fourth embodiment for convenience of description.

As illustrated in FIG. 31, the anode of the organic light-emitting diode OLED may serve as a touch electrode for the touch operation period Touch in the ninth embodiment. For this, the first control transistor TR1 may be turned off for the touch operation period Touch. However, the first control transistor TR1 may be turned on only in the same period as the period in which the sixth transistor T6 is turned on even in the touch operation period Touch for initialization of the anode of the organic light-emitting diode OLED.

The first control transistor TR1 may be configured as a p-type transistor. The first control transistor TR1 may have a gate electrode connected to the node control signal line CS, a first gate electrode connected to the second electrode of the fourth transistor T4 and the first electrode of the sixth transistor T6, and a second electrode connected to the anode of the organic light-emitting diode OLED and the touch sensing line SL.

The first control transistor TR1 may be turned on for the display operation period Display and turned off for the touch operation period Touch like the fourth transistor T4 connected to the emission control signal line EM[n]. Accordingly, the first control transistor TR1 may be connected to the emission control signal line EM[n] like the fourth transistor T4. That is, the ninth embodiment can overcome disadvantages due to increase in the number of signal lines and difficulty of design due to arrangement of signal lines.

Furthermore, the ninth embodiment can improve electrical independence of the anode of the organic light-emitting diode OLED, which serves as a touch electrode, based on the first control transistor TR1 turned off in the touch operation period Touch. In other words, it is possible to enhance blocking of electrical interference that may be caused by operations of transistors (e.g., T4 and T6) when the anode of the organic light-emitting diode OLED serves as a touch electrode. Accordingly, the ninth embodiment can improve operation independence (display operation) of the device for emission of sub-pixels and operation independence (touch operation) of the device for touch sensing.

Meanwhile, the second control transistor is not provided in the ninth embodiment unlike the fourth embodiment. However, the second control transistor may depend on the sensing method of the touch driver 145 and thus it may be added as in the fourth embodiment or may be omitted.

Figure 32:
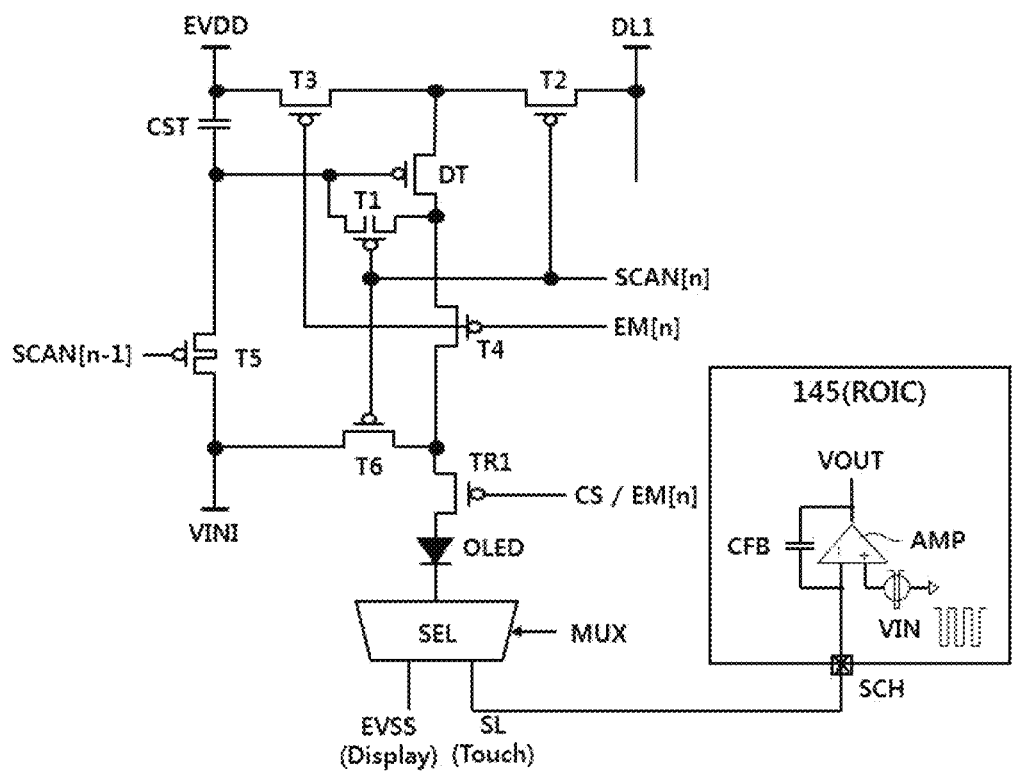
FIG. 32 is a diagram illustrating a touch electrode and a touch driver according to a tenth embodiment of the present disclosure.

FIG. 32 is a diagram illustrating a touch electrode and a touch driver according to a tenth embodiment of the present disclosure. Hereinafter, the tenth embodiment of the present disclosure, which is a modified embodiment referred to when the fifth to eighth embodiments are realized, will be described focusing on parts modified from the eighth embodiment for convenience of description.

As illustrated in FIG. 32, the cathode of the organic light-emitting diode OLED may serve as a touch electrode for the touch operation period Touch in the tenth embodiment. For this, the first control transistor TR1 may be turned off for the touch operation period Touch. However, the first control transistor TR1 may be turned on only in the same period as the period in which the sixth transistor T6 is turned on even in the touch operation period Touch for initialization of the anode of the organic light-emitting diode OLED.

The first control transistor TR1 may be configured as a p-type transistor. The first control transistor TR1 may have a gate electrode connected to the node control signal line CS, a first gate electrode connected to the second electrode of the fourth transistor T4 and the first electrode of the sixth transistor T6, and a second electrode connected to the anode of the organic light-emitting diode OLED.

The first control transistor TR1 may be turned on for the display operation period Display and turned off for the touch operation period Touch like the fourth transistor T4 connected to the emission control signal line EM[n]. Accordingly, the first control transistor TR1 may be connected to the emission control signal line EM[n] like the fourth transistor T4. That is, the tenth embodiment can overcome disadvantages due to increase in the number of signal lines and difficulty of design due to arrangement of signal lines.

The tenth embodiment can improve electrical independence of the cathode of the organic light-emitting diode OLED, which serves as a touch electrode, based on the operation of the first control transistor TR1 turned off in the touch operation period Touch and the operation of the selector SEL that connects the cathode of the organic light-emitting diode OLED to the touch sensing line SL.

In other words, it is possible to enhance blocking of electrical interference that may be caused by operations of transistors (e.g., T4 and T6) when the cathode of the organic light-emitting diode OLED serves as a touch electrode. Accordingly, the tenth embodiment can improve operation independence (display operation) of the device for emission of sub-pixels and operation independence (touch operation) of the device for touch sensing.

Meanwhile, the second control transistor is not provided in the tenth embodiment unlike the eighth embodiment. However, the second control transistor may depend on the sensing method of the touch driver 145 and thus it may be added as in the eighth embodiment or may be omitted.

The present disclosure can realize a touch sensor electrically in common with an anode or a cathode included in a light-emitting diode to reduce the thickness of a touch display device and decrease the number of manufacturing processes and manufacturing cost of a display panel including the touch sensor. Furthermore, the present disclosure can overcome disadvantages due to increase in the number of signal lines and difficulty of design due to arrangement of signal lines when a touch sensor is realized electrically in common with an anode or a cathode included in a light-emitting diode. Moreover, the present disclosure can improve blocking of electrical interference between devices when a touch sensor is realized electrically in common with an anode or a cathode included in a light-emitting diode.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device, comprising:
a touch sensor including a touch electrode formed electrically in common with an electrode of a light-emitting diode included in the sub-pixels; and
a touch driver configured to sense the touch sensor,
wherein the electrode of the light-emitting diode serves as an electrode to cause the light emitting diode to emit light during a turn-on period of an emission control transistor for controlling emission of the light emitting diode and as the touch electrode during a turn-off period of an emission control transistor for controlling emission of the light-emitting diode,
wherein the electrode of the light-emitting diode includes a cathode and an anode, and further comprising a first control transistor disposed between a second electrode of the emission control transistor and the anode of the light-emitting diode, wherein the first control transistor is turned on for a display operation period for displaying an image on the display panel, and wherein the first control transistor is turned off for a touch operation period for touch sensing of the touch sensor.

2. The touch display device of claim 1, wherein the cathode of the light-emitting diode is electrically connected to a power line at a low voltage for a display operation period for displaying an image on the display panel.

3. The touch display device of claim 1, wherein the cathode of the light-emitting diode either electrically floats or is electrically connected to the touch driver for a touch operation period for touch sensing of the touch sensor.

4. The touch display device of claim 1, further comprising a second control transistor disposed between the anode of the light-emitting diode and a sensing channel of the touch driver, wherein the second control transistor is turned on for a touch operation period for touch sensing of the touch sensor.

5. The touch display device of claim 4, wherein each of the first control transistor and the second control transistor is configured as either an n-type transistor or a p-type transistor.

6. The touch display device of claim 1, wherein the touch driver performs a sensing operation through the electrode of the light-emitting diode for the turn-off period of the emission control transistor.

7. The touch display device of claim 1, further comprising:
a selector configured to electrically connect a cathode of the light-emitting diode to a power line at a low voltage for a display operation period for displaying an image on the display panel and to cause the cathode of the light-emitting diode to electrically float for a touch operation period for touch sensing of the touch sensor;
a first control transistor disposed between a second electrode of the emission control transistor and the anode of the light-emitting diode and turned on for the display operation period; and
a second control transistor disposed between the anode of the light-emitting diode and the sensing channel of the touch driver and turned on for the touch operation period,
wherein the electrode of the light-emitting diode is the anode.

8. The touch display device of claim 1, further comprising:
a selector configured to electrically connect a cathode of the light-emitting diode to a power line at a low voltage for a display operation period for displaying an image on the display panel and to electrically connect the cathode of the light-emitting diode to the touch driver for a touch operation period for touch sensing of the touch sensor; and
a first control transistor disposed between a second electrode of the emission control transistor and the anode of the light-emitting diode and turned on for the display operation period,
wherein the electrode of the light-emitting diode is the cathode.

9. The touch display device of claim 1, further comprising:
   a first control transistor disposed between a second electrode of the emission control transistor and an anode of the light-emitting diode and turned on for a display operation period for displaying an image on the display panel; and
   a second control transistor disposed between a cathode of the light-emitting diode and the sensing channel of the touch driver and turned on for a touch operation period for touch sensing of the touch sensor,
   wherein the electrode of the light-emitting diode is the cathode.

10. A method for driving a touch display device including a display panel including sub-pixels, a touch sensor including a touch electrode formed electrically in common with a common electrode of a light-emitting diode included in the sub-pixels, and a touch driver configured to sense the touch sensor, the method comprising:
   causing the sub-pixels to emit light based on a signal to the common electrode for a display operation during a turn-on period of an emission control transistor for controlling emission of the light emitting diode to display an image on the display panel; and
   sensing a voltage status of the common electrode of the light emitting diode for a touch operation during a turn-off period of an emission control transistor for controlling emission of the light-emitting diode for touch sensing of the touch sensor,
   wherein the light-emitting diode includes a cathode and an anode, and further comprising a first control transistor disposed between a second electrode of the emission control transistor and the anode of the light-emitting diode, wherein the first control transistor is turned on for a display operation period for displaying an image on the display panel, and wherein the first control transistor is turned off for a touch operation period for touch sensing of the touch sensor.

11. The method of claim 10, wherein sensing one of electrodes of the light emitting diode comprises:
   causing a cathode of the light-emitting diode to electrically float for the touch operation period;
   turning off a first control transistor disposed between a second electrode of the emission control transistor and an anode of the light-emitting diode;
   turning on a second control transistor disposed between the anode of the light-emitting diode and a sensing channel of the touch driver; and
   sensing the anode of the light-emitting diode.

12. The method of claim 10, wherein sensing one of electrodes of the light emitting diode comprises:
   electrically connecting the cathode of the light-emitting diode to the touch driver for the touch operation period;
   turning off a first control transistor disposed between the second electrode of the emission control transistor and the anode of the light-emitting diode; and
   sensing the cathode of the light-emitting diode.

13. A touch display device, comprising:
   a display panel including sub-pixels, the sub-pixels including:
      a light-emitting diode having a cathode electrode and an anode electrode; and
      an emission control transistor electrically connected to the light-emitting diode and configured to control emission of the light-emitting diode, the emission control transistor having a turn-off period and a turn-on period;
   a touch sensor including a touch electrode formed electrically in common with the electrode of the light-emitting diode included in the sub-pixels;
   a first transistor disposed between a second electrode of the emission control transistor and the anode of the light-emitting diode, and
   a touch driver configured to sense the touch sensor,
   wherein the light-emitting diode emits light during the turn-on period of the emission control transistor,
   wherein the touch sensor detects either the presence or absence of a touch based on the touch electrode during the turn-off period of the emission control transistor, and
   wherein at least one of the cathode electrode or the anode electrode of the light-emitting diode is the touch electrode for the turn-off period of the emission control transistor,
   wherein the first transistor is turned on for a display operation period for displaying an image on the display panel, and wherein the first transistor is turned off for a touch operation period for touch sensing of the touch sensor.

14. The touch display device of claim 13, further comprising:
   a selector having an input terminal, a first output terminal, and a second output terminal, the selector electrically connected to the cathode of the light-emitting diode, the selector configured to either electrically connect between the first output terminal and the input terminal or electrically connect between the second output terminal and the input terminal based on a select signal,
   wherein the selector is electrically connected to the first output terminal during the display operation period for displaying an image on the display panel,
   wherein the selector is electrically connected to the second output terminal during the touch operation period for touch sensing on the touch sensor,
   wherein the display operation period corresponds to the turn-on period of the emission control transistor, and
   wherein the touch operation period corresponds to the turn-off period of the emission control transistor.

15. The touch display device of claim 14, further comprising:
   a touch sensing line having a first end and a second end opposite the first end,
   wherein the touch driver is electrically connected to the first end of the touch sensing line,
   wherein the touch driver includes:
      an amplifier having a non-inverting terminal, an inverting terminal, and an output terminal; and
      a feedback capacitor electrically connected between the inverting terminal and the output terminal,
   wherein the second output terminal of the selector is electrically connected to the second end of the touch sensing line, and
   wherein the first output terminal of the selector is electrically connected to a power supply.

16. The touch display device of claim 13, further comprising:
   a selector having an input terminal, a first output terminal, and a second output terminal, the selector electrically connected to the cathode of the light-emitting diode, the selector configured to either electrically connect between the first output terminal and the input terminal or electrically connect between the second output terminal and the input terminal based on a select signal; and a touch sensing line having a first end and a second end opposite the first end;

wherein the touch driver is electrically connected to the first end of the touch sensing line, the touch driver including:

an amplifier having a non-inverting terminal, an inverting terminal, and an output terminal; and a feedback capacitor electrically connected between the inverting terminal and the output terminal, wherein the second end of the touch sensing line is electrically connected to the anode of the light-emitting diode, wherein the second output terminal of the selector is electrically floating, wherein the first output terminal of the selector is electrically connected to a power supply wherein the selector is electrically connected to the first output terminal during a display operation period for displaying an image on the display panel, and wherein the selector is electrically connected to the second output terminal during a touch operation period for touch sensing on the touch sensor.

17. The touch display device of claim 13, further comprising:

a second transistor electrically connected to the cathode of the light-emitting diode, the second transistor configured to be controlled based on a second control signal opposite of the first control signal, wherein the first transistor is configured to be controlled based on a first control signal, wherein the touch driver is electrically connected to the second transistor, the touch driver including:

an amplifier having a non-inverting terminal, an inverting terminal, and an output terminal; and a feedback capacitor electrically connected between the inverting terminal and the output terminal, wherein the first transistor is turned on for the display operation period and turned off for the touch operation period, wherein the second transistor is turned off for the display operation period and turned on for the touch operation period, wherein the display operation period corresponds to the turn-on period of the emission control transistor, and wherein the touch operation period corresponds to the turn-off period of the emission control transistor.

18. The touch display device of claim 13, further comprising:

a second transistor electrically connected to the anode of the light-emitting diode, the second transistor configured to be controlled based on a second control signal opposite of the first control signal, wherein the first transistor is configured to be controlled based on a first control signal;

wherein the touch driver is electrically connected to the second transistor, the touch driver including:

an amplifier having a non-inverting terminal, an inverting terminal, and an output terminal; and a feedback capacitor electrically connected between the inverting terminal and the output terminal, a selector having an input terminal, a first output terminal, and a second output terminal, the input terminal of the selector electrically connected to the cathode of the light-emitting diode, the selector configured to either electrically connect between the first output terminal and the input terminal or electrically connect between the second output terminal and the input terminal based on a select signal of the selector;

wherein the first output terminal of the selector is electrically connected to a power supply, wherein the second output terminal of the selector is electrically floating, wherein the selector is electrically connected to the first output terminal during a display operation period for displaying an image on the display panel, and wherein the selector is electrically connected to the second output terminal during a touch operation period for touch sensing on the touch sensor.

\* \* \* \* \*